United States Patent [19]
Yamazaki et al.

[11] Patent Number: 5,204,939
[45] Date of Patent: Apr. 20, 1993

[54] RULE BASE PROCESSING SYSTEM AND RULE EVALUATION CONTROL METHOD THEREIN

[75] Inventors: Masami Yamazaki, Fuchu; Hisayo Fukushima, Kawasaki, both of Japan

[73] Assignee: Fujitsu Limited, Kawasaki, Japan

[21] Appl. No.: 627,151

[22] Filed: Dec. 13, 1990

[30] Foreign Application Priority Data

Dec. 14, 1989 [JP] Japan ................................ 1-322603
Mar. 19, 1990 [JP] Japan ................................ 2-69452

[51] Int. Cl.$^5$ ............................................ G06F 15/18
[52] U.S. Cl. ...................................... 395/51; 395/921
[58] Field of Search .................... 364/513; 395/51, 50, 395/61, 11

[56] References Cited

U.S. PATENT DOCUMENTS

| | | | |
|---|---|---|---|
| 4,803,636 | 2/1989 | Nishiyama et al. | 364/491 |
| 4,924,408 | 5/1990 | Highland | 364/513 |
| 4,949,278 | 8/1990 | Davies et al. | 364/513 |
| 4,959,799 | 9/1990 | Yoshiura et al. | 364/513 |
| 5,022,498 | 6/1991 | Sasaki et al. | 187/127 |
| 5,051,923 | 9/1991 | Tsukagoshi | 364/513 |

OTHER PUBLICATIONS

Hamacher et al., Computer Organization, 2nd ed., McGraw-Hill, 1984, 288–290, 303.
Brownston et al., Programming Expert Systems in OPS5, Addison-Wesley Pub., 1985, 197–203, 209, 210, 306–308.
Guru Quick Reference, MDBS, 1987.
Pedersen, K., "Connecting Expert Systems and Conventional Environments", AI Expert, May 1988, pp. 26–35.
Leaman, C. M., "Rule-Based Structural Design in C", AI Expert, May 1989, pp. 28–34.
Tello, E. R., Mastering AI Tools and Techniques, Howard W. Sams & Co., 1988, pp. 137–320.
Charniak et al., Artificial Intelligence Programming 2nd ed., Lawrence Erlbaum Assoc., 1987, pp. 6,7,248–275.
EXSYS El Expert System Development Tool, EXSYS Inc., 1988, pp. A-13–A-17.
EXSYS Professional Brochure, EXSYS Inc., 1988.

Primary Examiner—Michael R. Fleming
Assistant Examiner—Robert W. Downs
Attorney, Agent, or Firm—Staas & Halsey

[57] ABSTRACT

A rule base processing system for processing rules with an inference engine is provided with a control block and a number of knowledge source blocks containing the rules. The control block contains a knowledge source list of the knowledge source blocks and a function name through which the control block may be called as a subprogram. The knowledge source blocks contain priority sequence tables in which the sequence of execution of the rules is arranged and can be externally controlled. Each rule in the knowledge source contains a number of detailed rules from which an optimum rule is selected.

19 Claims, 30 Drawing Sheets

FIG. 3A

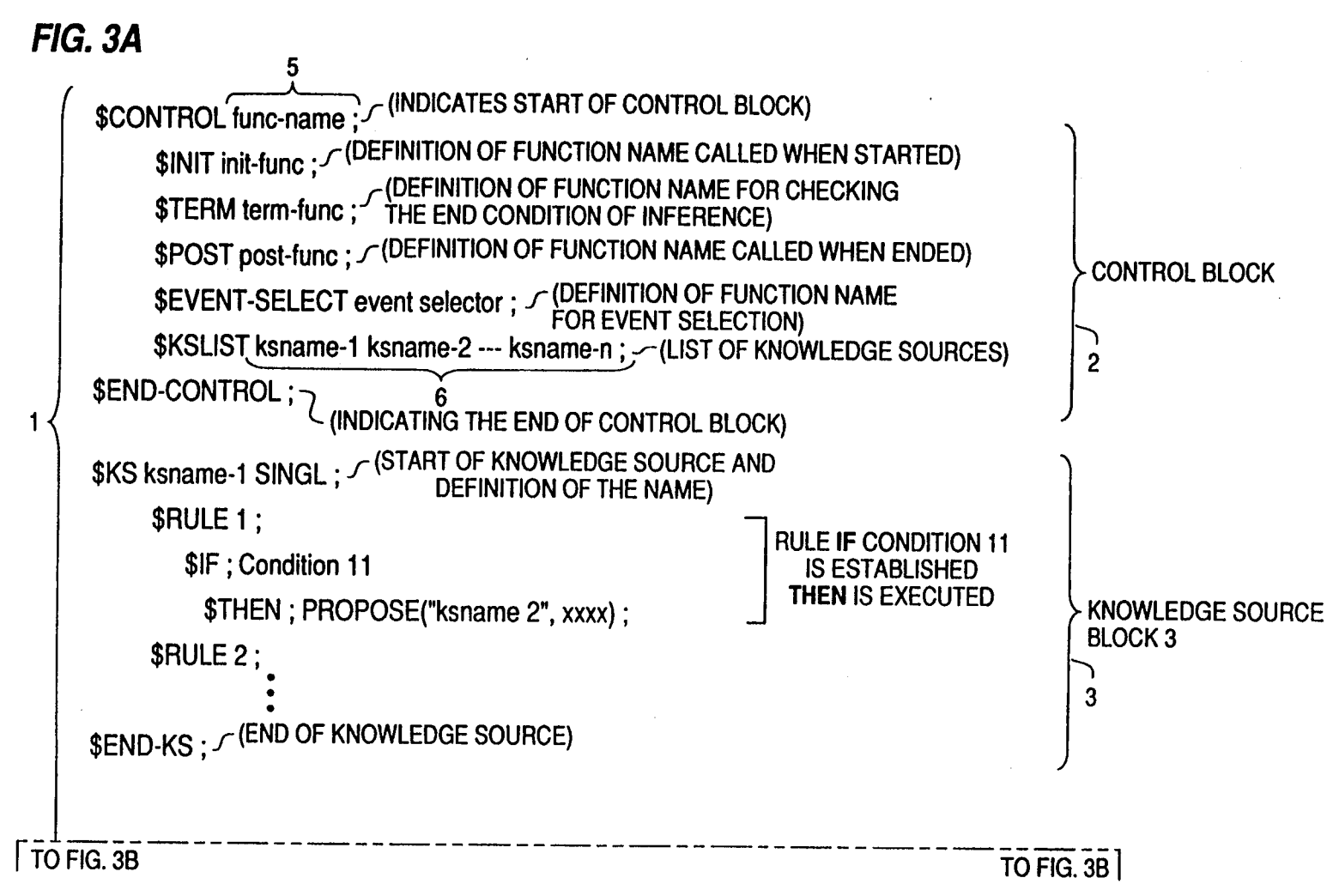

```
$CONTROL func-name ;       (INDICATES START OF CONTROL BLOCK)
  $INIT init-func ;        (DEFINITION OF FUNCTION NAME CALLED WHEN STARTED)
  $TERM term-func ;        (DEFINITION OF FUNCTION NAME FOR CHECKING
                            THE END CONDITION OF INFERENCE)
  $POST post-func ;        (DEFINITION OF FUNCTION NAME CALLED WHEN ENDED)
  $EVENT-SELECT event selector ;  (DEFINITION OF FUNCTION NAME
                                   FOR EVENT SELECTION)
  $KSLIST ksname-1 ksname-2 --- ksname-n ;  (LIST OF KNOWLEDGE SOURCES)
$END-CONTROL ;             (INDICATING THE END OF CONTROL BLOCK)

$KS ksname-1 SINGL ;       (START OF KNOWLEDGE SOURCE AND
                            DEFINITION OF THE NAME)
  $RULE 1 ;
    $IF ; Condition 11
    $THEN ; PROPOSE("ksname 2", xxxx) ;
  $RULE 2 ;
    ...
$END-KS ;                  (END OF KNOWLEDGE SOURCE)
```

5 — CONTROL BLOCK (2)

6 —

RULE IF CONDITION 11 IS ESTABLISHED THEN IS EXECUTED

KNOWLEDGE SOURCE BLOCK 3 (3)

```
$KS ksname-2 MULTI PR10 (size table) ;
    $RULE 1 ;
        $IF ; Condition 21
        $THEN ; Procedure 21              } 10
    $RULE 2 ;         (CASE 1 OR 2 WITH THE MAXIMUM EVALUATION
                       RESULT IS EXECUTED)
        $SELECT MAX 2 ;
            $EVAL var ;
                $CASE 1 ;
                    var = Evaluation Procedure 1
                $END CASE ;
                $CASE 2 ;
                    var = Evaluation Procedure 2
                $END-CASE ;
            $END-EVAL ;
            $WHEN 1 ; Procedure 1 ;   (PROCEDURE 1 IS EXECUTED WHEN
                                       THE EVALUATION VALUE OF CASE 1 IS MAXIMUM)
            $WHEN 2 ; Procedure 2 ;   (PROCEDURE 2 IS EXECUTED WHEN
                                       THE EVALUATION VALUE OF CASE 2 IS MAXIMUM)
        $END-SELECT ;
    $END-RULE ;
$END-KS ;   (END OF KNOWLEDGE SOURCE)
...
```

7, 10, 13, 12 — KNOWLEDGE SOURCE BLOCK 4 (11), 4

FROM FIG. 3A

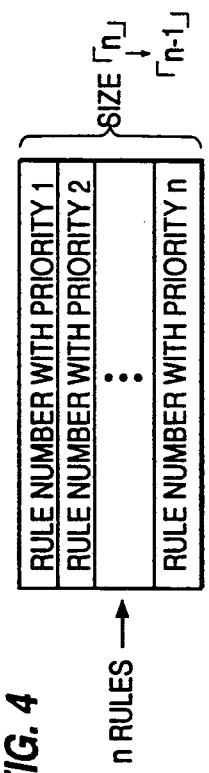
FIG. 4
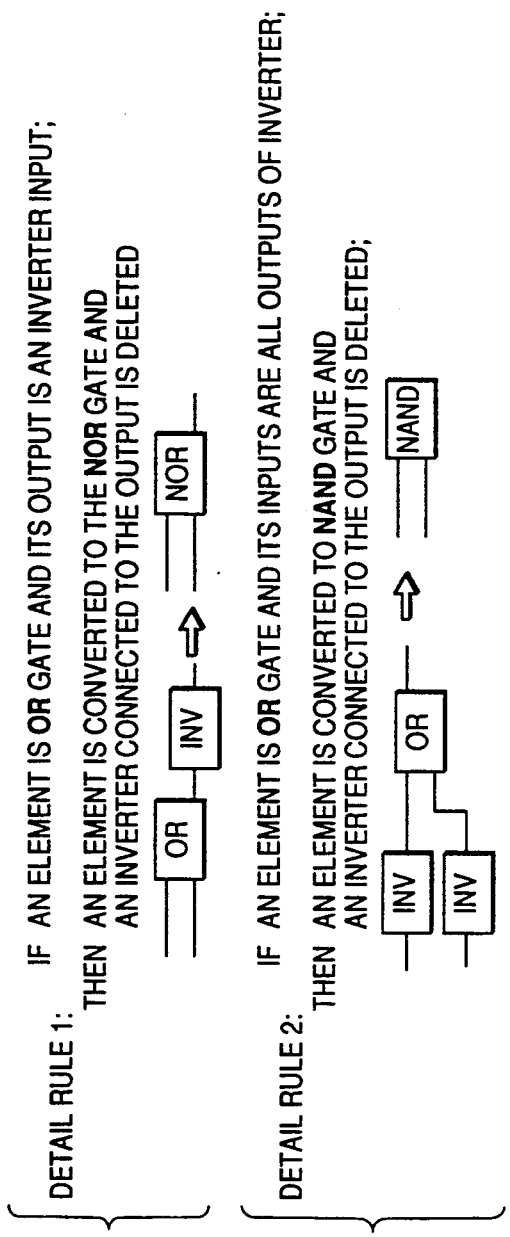
DETAIL RULE 1: IF AN ELEMENT IS OR GATE AND ITS OUTPUT IS AN INVERTER INPUT;
THEN AN ELEMENT IS CONVERTED TO THE NOR GATE AND AN INVERTER CONNECTED TO THE OUTPUT IS DELETED
FIG. 5A
DETAIL RULE 2: IF AN ELEMENT IS OR GATE AND ITS INPUTS ARE ALL OUTPUTS OF INVERTER;
THEN AN ELEMENT IS CONVERTED TO NAND GATE AND AN INVERTER CONNECTED TO THE OUTPUT IS DELETED;
FIG. 5B
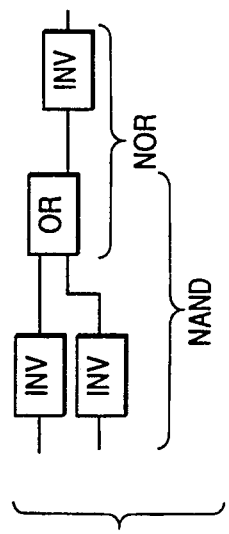
FIG. 5C

FIG. 6

```
$RULE n ;
    $SELECT MAX 2 ;
        $EVAL var ;
            $CASE 1 ;
                var = ⎯⎯⎯ A NUMBER OF INVERTERS CONNECTED TO THE OUTPUT WHICH MAY BE
                         DELETED BY CONVERTING AN ELEMENT, WHEN IT IS OR ELEMENT, TO THE
            $END-CASE ;  NOR ELEMENT; IT IS 0 WHEN AN ELEMENT IS OTHER THAN OR.
            $CASE 2 ;
                var = ⎯⎯⎯ A NUMBER OF INVERTERS CONNECTED TO THE INPUT WHICH MAY BE
                         DELETED BY CONVERTING AN ELEMENT, WHEN IT IS OR ELEMENT, TO THE
            $END-CASE ;  NOR ELEMENT; IT IS 0 WHEN AN ELEMENT IS OTHER THAN OR.
        $END-EVAL ;
        $WHEN 1 ; ⎯⎯⎯ AN OR ELEMENT IS CONVERTED TO THE NOR ELEMENT AND AN INVERTER
                      CONNECTED TO THE OUTPUT IS DELETED.
        $WHEN 2 ; ⎯⎯⎯ AN OR ELEMENT IS CONVERTED TO THE NAND ELEMENT AND AN INVERTER
                      CONNECTED TO THE INPUT IS DELETED.
    $END-SELECT ;
$END-RULE ;
```

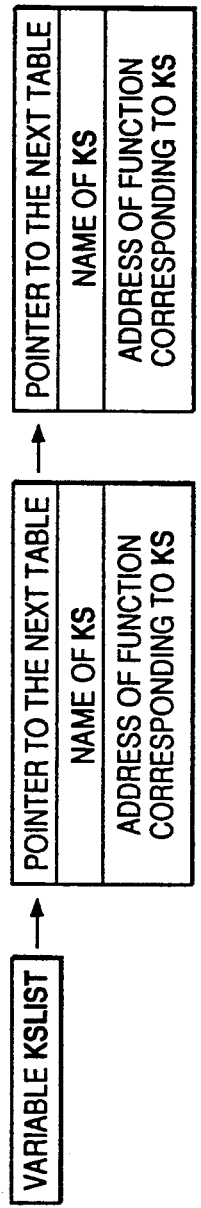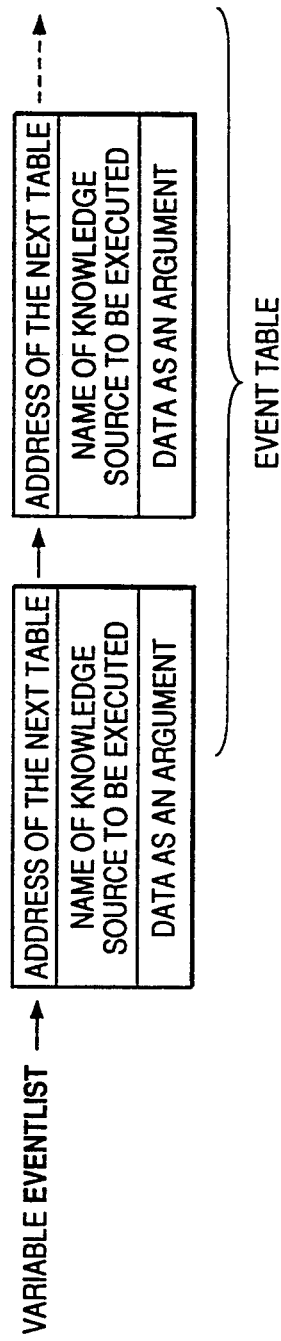

FIG. 17A

STRUCTURE OF RULE BASE

RULE BASE

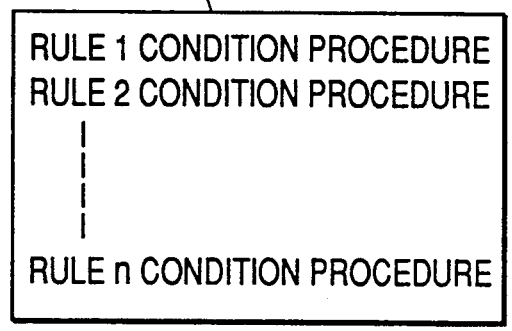

RULE 1 CONDITION PROCEDURE
RULE 2 CONDITION PROCEDURE

RULE n CONDITION PROCEDURE

RULE EVALUATION SEQUENCE
ARRANGEMENT DATA SEQ $$SEQ[i], i = 1, 2, \cdots, n$$

SEQ(i) MEANS THE SEQUENCE
TO APPLY THE i-th RULE

EVALUATION CONTROL MODE 1; EVALUATION IS CONTINUED SO LONG AS THE RULE EXISTS.

EVALUATION CONTROL MODE 2; EVALUATION IS NOT CARRIED OUT FOR THE SUBSEQUENT RULES WHEN THE ONE RULE FOR WHICH THE CONDITION IS ESTABLISHED EXISTS.

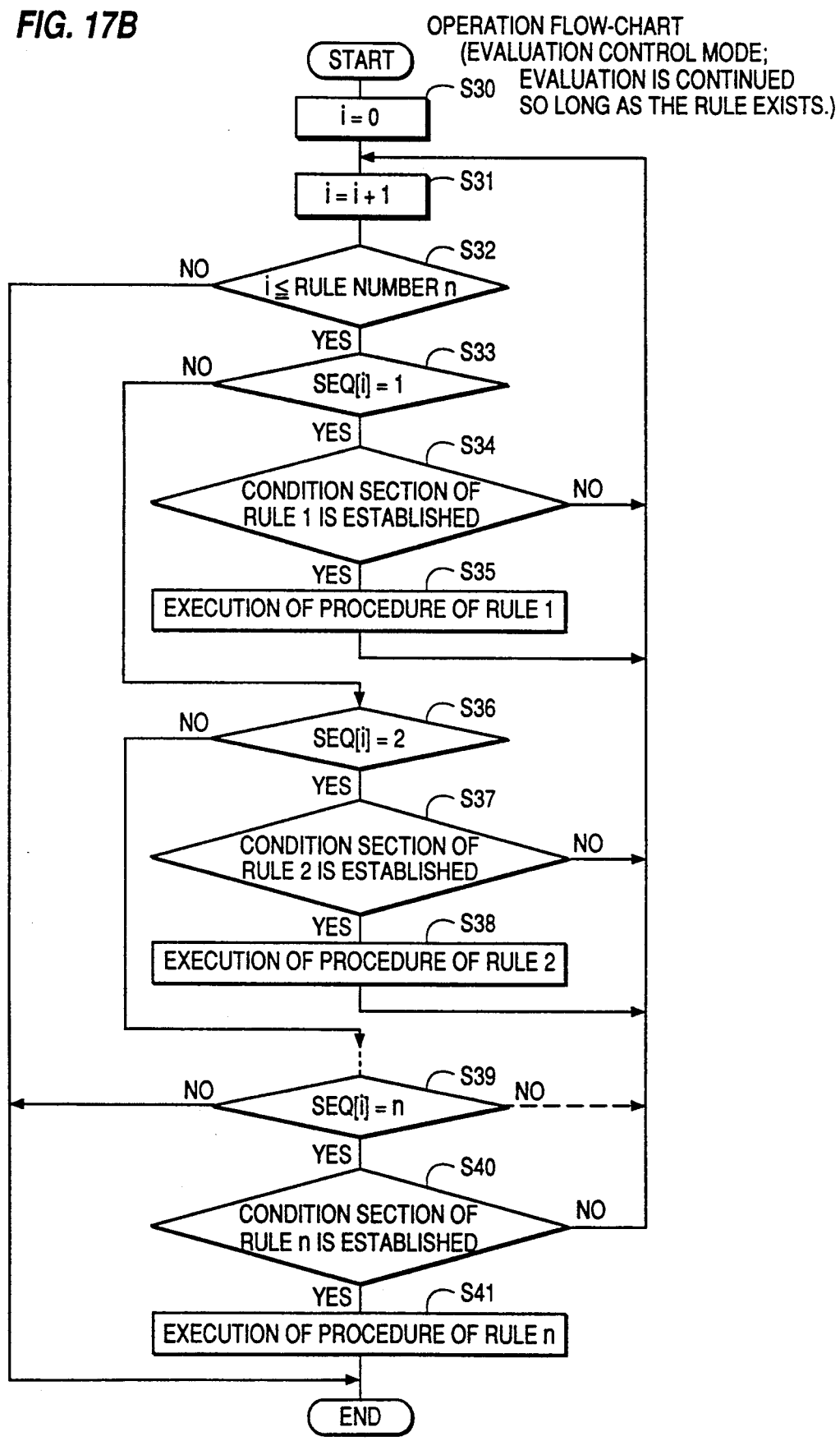

FIG. 18A

RULE BASE

| RULE NO. | CONDITION | PROCEDURE |
|---|---|---|
| --- | --- | --- |
| RULE i | $X = CS + \overline{DS}$ | HIGH SPEED PART I IS SELECTED FROM PARTS LIBRARY. |
| RULE i + 1 | $X = CS + \overline{DS}$ | SMALL CIRCUIT AREA PART J IS SELECTED FROM PARTS LIBRARY. |
| --- | --- | --- |

FIG. 19A

STRUCTURE OF RULE BASE
RULE BASE

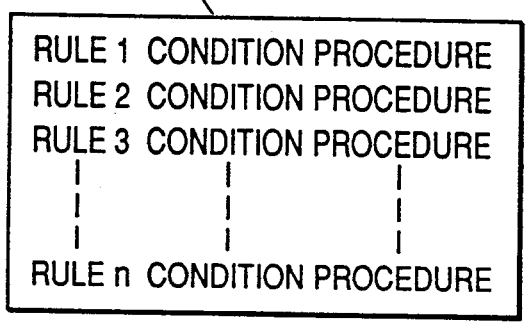

```
RULE 1  CONDITION  PROCEDURE
RULE 2  CONDITION  PROCEDURE
RULE 3  CONDITION  PROCEDURE
   |        |          |
   |        |          |
RULE n  CONDITION  PROCEDURE
```

EVALUATION CONTROL MODE 1; EVALUATION IS CONTINUED SO LONG AS RULE EXISTS.

EVALUATION CONTROL MODE 2; EVALUATION FOR SUBSEQUENT RULES IS NOT CARRIED OUT WHEN A RULE FOR WHICH THE CONDITION SECTION IS ESTABLISHED EXISTS.

DESCRIPTION OF FUNCTION LEVEL (EXAMPLE)  INPUT = A, B, S   OUTPUT = X

IF S = 1   THEN X = A $*$ B
IF S $\neq$ 1   THEN X = A + B

DESCRIPTION OF LOGIC LEVEL (EXAMPLE)   X = ABS + (A + B)$\overline{S}$

CIRCUIT DIAGRAM

RULE BASE PROCESSING SYSTEM AND RULE EVALUATION CONTROL METHOD THEREIN

BACKGROUND OF THE INVENTION

1. Field of the Invention

The present invention relates to a rule base processing system wherein rules are described in a rule base by a rule description language, and more particularly, to a rule base processing system in which rules in the rule base are provided in knowledge source blocks of rules between which the sequence of priority for execution can be changed. A control block is provided for controlling execution of the knowledge source blocks. The rule base processing system can be structured as a subsystem created by providing the control block with a function name. Finally, the rules may be provided with a number of rules from which an optimum rule is selected for a particular application.

2. Description of the Related Art

A rule base processing system is one way of realizing an expert system. An example of such a complied rule base processing system is ESHELL, described, for example, on page 1078 of the Information Processing Handbook, May 30, 1989 and available from Fujitsu, Inc. of Japan. To solve a problem with such a system, knowledge in the expert system is stored in the rule base as rules that can be sequentially called by the inference engine for execution. Rule base processing systems are beginning to be used practically in various fields, such as LSI circuit design, medical diagnosis, tax planning and money related consultation, etc. Namely, such systems are designed so that human knowledge can be input, as rules, into a computer system, and decisions made by the computer system.

In a conventional rule base processing system a rule base is formed by combining a number of rules described in a rule description language. Each rule has a condition section and a procedure section. For example, in designing an electrical circuit, a description of a rule in the language would be made as follows:

In the condition section: "IF A*B"
In the procedure section: "THEN select AND circuit".

In conventional rule base processing, the conditions in the condition section are evaluated sequentially starting with the first rule in the rule base. When the condition exists, the corresponding procedure is executed. A rule base system is commonly employed in programs for structuring or designing systems through trial and error. However, such an application has been difficult to accomplish using a general purpose computer language, which mainly consists of conventional algorithms for solving problems. For this reason, a rule base system has initially been written using a processing language having an interpreter, such as LISP, as the core. This is because it is difficult to describe a rule conforming to a suitable grammar and then process it with a compiler type language. In other words, a language which must be compiled is typically not suitable for the description of rules.

However, when an interpreter language such as LISP is used, because processing speed is low and a large memory area is used, it has been impractical to design a large system, such as an integrated circuit. For this reason, a rule base system using a compiler language has been developed.

In a compiler rule base system, a rule base source, similar to a source program in a language such as Fortran, is described by a rule description language suitable for description of expert rules such as LISP. The inference engine is programmed, for example, in a compiler language such as the C language. The rule base source is first translated into the base language, in this case, into the C language by the rule base compiler and a source program is generated. The rule base system (executable program) is compiled with the inference engine program with respective compilers and combined.

However, structuring of the conventional compiler rule base system described above includes several problems. The conventional rule base description system obtains control information, such as the knowledge source list required by the inference engine, by retrieving it as a whole at the time of translation of the rule base source. Therefore, the rule base source language must be a single file. Accordingly, it is difficult to compile a large scale rule base, for example, one exceeding several tens of thousands of rules, and maintain the rule base.

In a system for processing large problems such as the composition and design of electronic circuits, an improvement has been suggested in which the rule base processing system would be employed only for a part of the design process, and high speed algorithmic processing would provide the remainder. However, it is difficult to realize this combination in a conventional rule base system because the rule base itself is the main program in the system.

Another problem is that optimum processing, for example, for designing circuits, is sometimes required to satisfy contradictory conditions in a designer's request, for example, the scale of the circuit must be as small as possible, and delay time of the circuit must be minimized. However, since the priority of rule execution in the knowledge source of the conventional rule base is already determined, and thereby fixed, it is impossible to generate a knowledge base which simultaneously satisfies both of these conditions.

Further, a rule in the conventional rule base generally employs the format, "if . . . , conduct . . . ". In a case where m rules exist in an n rule base specifically for minimization of electronic circuits and other rules exist for other applications, it is best to select the most effective rules for improvement in the quality of the electronic circuits to be generated. The general format of the rules as explained above cannot satisfy this requirement because the first rule that satisfies the condition whether or not it is the best rule is executed. The conventional method requires a process either for generating a rule base where the arrangement sequence of the rules is different for each application condition, or for generating a rule where an application condition test is added to the condition part of the rule. In either of these two solutions, the rule base becomes large and the structure becomes complicated, lowering the development efficiency.

SUMMARY OF THE INVENTION

It is therefore an object of the present invention to allow changing the evaluation sequence of the rules without changing the rule base itself to improve rule base development efficiency.

It is also an object of the present invention to provide a rule base processing system structured to call a rule base system as a subprogram.

It is another object of the present invention to provide a rule base system which generates a knowledge source depending on various requests.

The above objects can be accomplished by a rule base processing system with a control block and a number of knowledge source blocks. The control block contains a knowledge source list of the knowledge source blocks and a function name through which the control block may be called as a subprogram. The knowledge source blocks contain a priority sequence table in which the sequence of execution of the rules is arranged and can be externally controlled. Each rule in the knowledge source may contain a number of rules from which an optimum rule is selected. The priority sequence table describes the priority sequence of the rules independent of the order of the rules in the block.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 3A and 3B are a diagram of a structure of a rule base source.

FIG. 4 is an example of a priority sequence table.

FIGS. 5A, 5B and 5C provide an example of rule optimization of rules.

FIG. 6 is a diagram indicating a structure of optimization-oriented rules.

FIG. 8 is a knowledge source block (KS) table.

FIG. 14 shows an event queue.

FIG. 17A is a diagram indicating an example rule base structure in the present invention.

FIG. 17B is an operation flowchart for executing the rule base in the present invention.

FIG. 18A is an example of a rule base in the present invention.

FIG. 19A is a diagram of conventional rule base.

FIG. 25A is an example of the generally indicated symbol circuit diagram and FIGS. 25B, C are examples of circuit diagram for explaining that two kinds of priority sequences are determined for the example of eight inputs.

DESCRIPTION OF THE PREFERRED EMBODIMENTS

Figure 1:
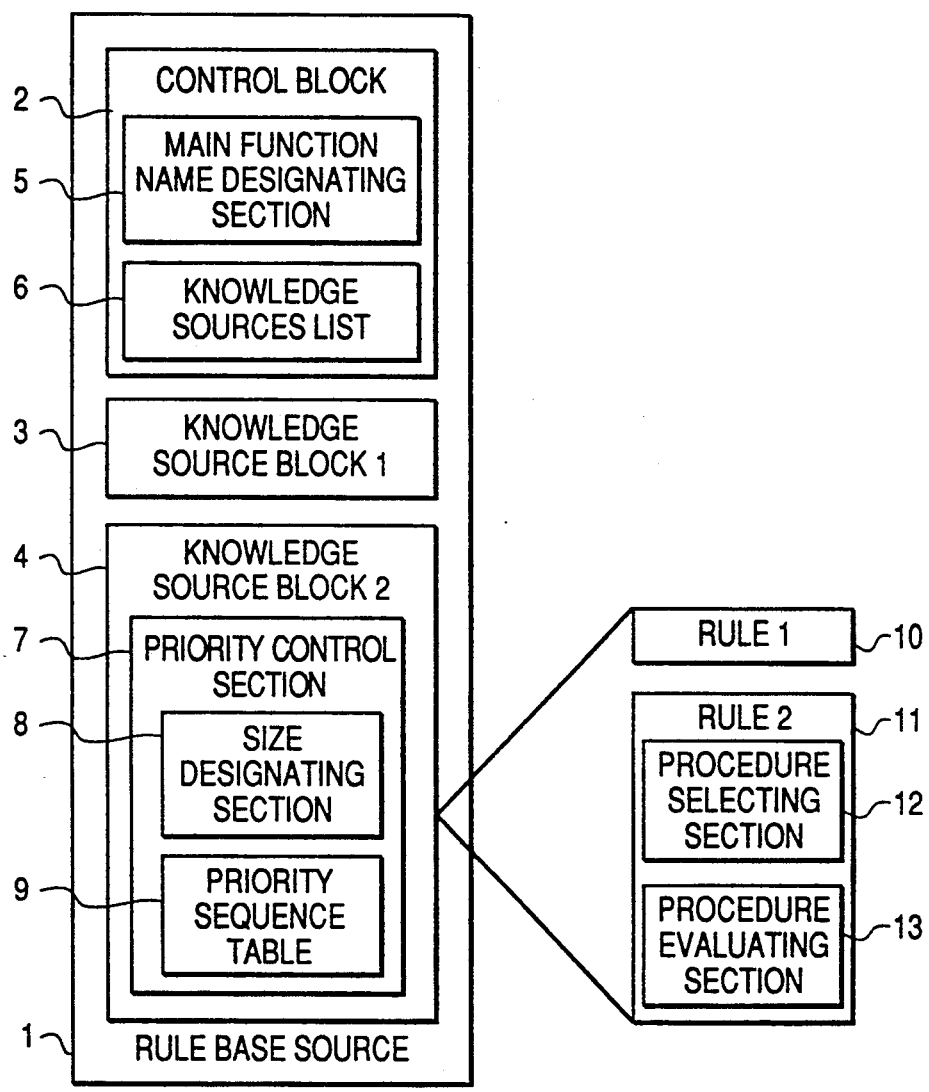
FIG. 1 is a diagram indicating the principle structure of a preferred embodiment of the present invention.

FIG. 1 represents a first embodiment of the invention and illustrates a structure of the rule base source 1 stored in a storage such as a magnetic disk memory or a random access memory. The rule base source 1 is described using a conventional rule description language suitable for the description of rules. A control block 2 describes control information for initialization of the rule base system and for a procedure for terminating execution after the execution is finished. The control block 2 is provided at the front of the source 1 and comprises a main function name designating section 5 and a knowledge source list 6 as part of the control information. Knowledge source blocks 3 and 4 are provided in the source 1. Knowledge source block 4 includes a priority sequence table 9, a procedure selecting section 12 and a procedure evaluating section 13, while knowledge source block 3 does not comprise these elements. In the knowledge source block 4, the priority sequence table 9 is provided in a priority control section 7 along with a size designating section 8. The priority control section 7 stores information for controlling the priority or sequence of rule evaluation in the relevant knowledge source block 4 and therefore it is provided at the front of the knowledge source block 4. The size designating section 8 designates the table size of the priority sequence table 9. The priority description or sequence of rule execution can be changed in the priority sequence table 9 or rules can be eliminated from execution by changing the table size and thus the priority sequence of rules can substantially be changed without changing the contents of the rule base. Plural rules 10 and 11 are provided in the knowledge source block 4. These rules may include a number of selectable (detail) rules from which one rule is selected. Rules 11 include a number of detail rules, while rule 10 does not include detail rules.

Each of the detail rules includes plural cases and each case produces a numeral value. The procedure evaluating section 13 produces an evaluation value from each evaluation case, and the optimum procedure, for example, the detail rule having the maximum (or minimum) evaluation value or result, is selected by the procedure selecting section 12. The priority control section 7 is required to exist in the same knowledge source block in this instance.

Since the control block 2 already has a knowledge source list 6, a knowledge source list for the inference engine may be generated by translating the knowledge source list 6 with the rule base compiler. Therefore, it is no longer necessary to generate a list by retrieving the rule base source 1 using the rule base compiler at the time of translation. Thereby since the rule base source 1 may be extended to a number of files, a large scale rule base which ensures easy maintenance can be realized.

Moreover, since the control block 2 stores the main function names indicating the rule base source 1, an object program is generated by translating the rule base source corresponding to the main function name designated from the host system with the rule base compiler. A rule base subsystem may thereby be structured with the object program and the inference engine. That is, since the rule base system may be called as a subsystem using the main function name, it is possible to structure the rule base system as a part of a large scale system and form an integrated system having a number of rule base subsystems.

Moreover, since the knowledge source block (for example, 4) is provided with a priority sequence table 9, the priority sequence of the rules may be changed merely by changing the priority sequence table 9 and without changing the rule base (rules 10, 11 and the arranging part). That is, the rule base compiler evaluates the rules 10, 11 in accordance with the order in the priority sequence table 9. Thereby, the evaluation sequence of the rules may be changed easily and optimum processing may be ensured even for the problems for which various conditions are set. In addition, since the rule 11 comprises a number of detail rules, a procedure evaluating section 13 and a procedure selecting section 12, evaluation is carried out by the procedure evaluating section 13 for each detail rule by translating the rule 11 with the rule base compiler and thereby the procedure selecting section 12 selects one detail rule. Accordingly, an optimum detail rule for solving a problem may be selected from a plurality of detail rules base on the evaluation, and thereby optimum processing may be realized.

Figure 2:
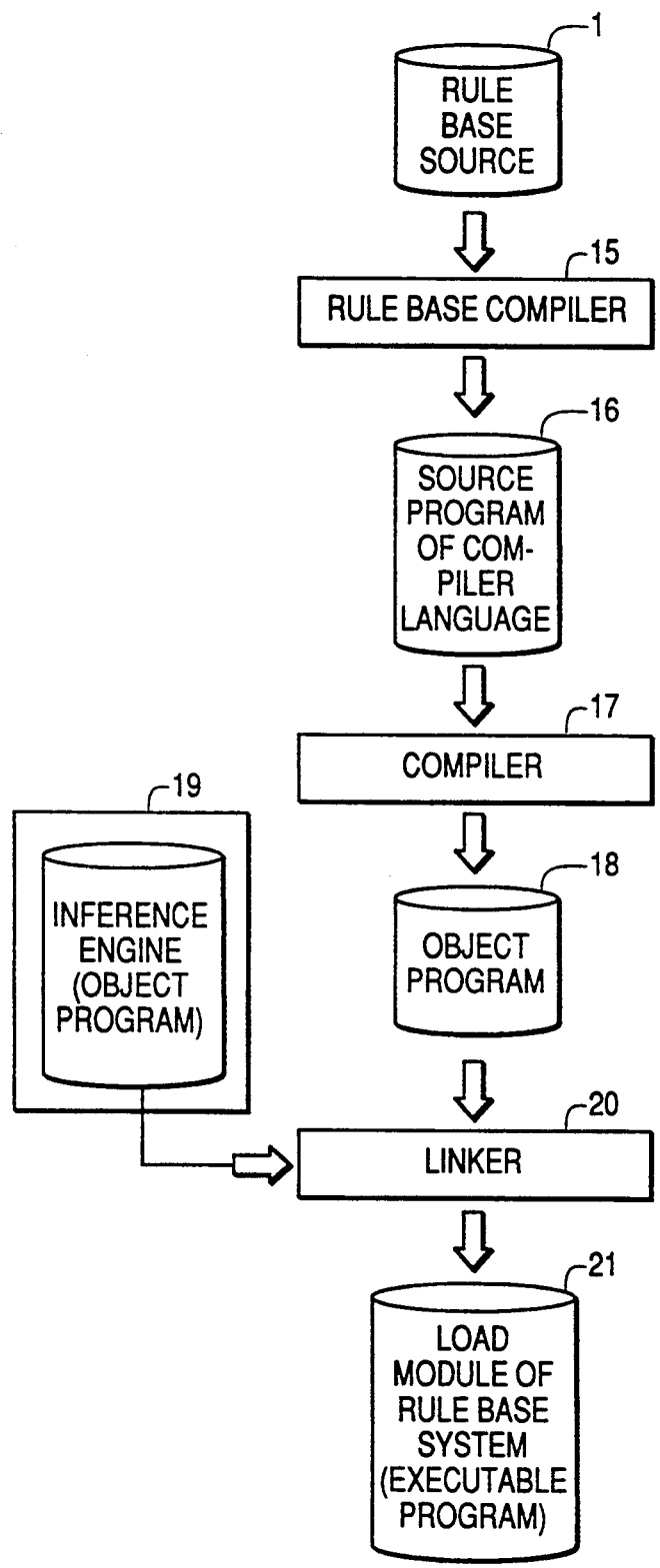
FIG. 2 explains the structure and processing of a rule base system.

As illustrated in FIG. 2, the rule base source 1 described using a conventional rule description language (for example, LISP, Prolog, etc.) is translated into the source program 16, in a predetermined language, by a rule base compiler 15. This predetermined language is also used to describe or provide the program for the inference engine 19, and usually a compiler language such as the C language is used. The source program 16 is translated by a language compiler 17 to generate a rule base object program 18. A load module (executable program) 21 of the rule base system is generated by coupling or linking the inference engine object program 19 and the rule base object program 18 through a linker 20. The rule base compiler 15 generates the source program 16 from the knowledge source list for the inference engine from the knowledge source 1 at the time of translation from a rule base source provided with the structure as shown in FIG. 1. The main function name from the main function name designating section 5 of the source 1 is used as the name of the source program 16, so that the function of the designated name is generated.

When the load module 21 is executed, the inference engine 19 evaluates the rules 10 and 11 in the sequence set forth in the priority sequence table 9 and in accordance with the structure of the rule base source. With respect to rule 11, depending on the evaluation of rule 11, the optimum procedure (detail rule) is selected.

Next, the details of the structure of the rule base source 1 will be explained with reference to FIG. 3 through FIG. 6.

FIG. 3 shows a structure of the rule base source 1 corresponding to FIG. 1 and represents the general structure of a description in the rule description language. Of course, for a specific use, the conditions, procedures, etc. would be specifically programmed. In this figure, the start of the control block 2 (and substantial relevant source 1) is indicated by "$CONTROL" and the end of the control block 2 is indicated by "$END-CONTROL". Following "$CONTROL", control information is provided. The main function name designating section 5 is provided as "func_name" and an adequate function name is described here. The "init_func" names the routine to be called for initialization when the relevant rule base is started, the "term_func" names the routine to be called for checking the end conditions of an inference by inference engine, the "post_func" names the routine to be called for postprocessing when the relevant rule base is terminated, and the "eventselector" is provided for event selection. Finally, a knowledge source list 6 is provided following "$KSLIST" in the form of "ksname-1, ksname-2".... "Ksname-1" indicates, for example, the name of one knowledge source block, for example, knowledge source block 3.

Next, the actual knowledge source block information is provided. "$KS" and "$END-KS" respectively indicate the start and end of knowledge source blocks 3, 4. For example, "$KS Ksname-1" indicates the start, and definition name, of knowledge source block 3. "$RULE1" indicates the start of rule 1. "$END-RULE1" indicates the end of rule 1. "$END-KS" indicates the end of the arrangement of rules. The knowledge source block 3 includes rule 1, rule 2, etc.) and its selection mode is designated as "SINGLE". The mode designation "SINGLE" indicates that only the procedure section (THEN section) of the first rule in which a condition is satisfied is executed. Accordingly, in the knowledge source block 3, evaluation is sequential starting from the first rule. In this situation order or arrangement of the rules conforms to the desired priority sequence. In the example of rule 1, when it is determined that "the condition 11 exists, the procedure is executed. The description "PROPOSE" in the procedure section (THEN section) indicates performance of an event. For the case of "PROPOSE" (ksname-2", xxxx), a certain knowledge source block (knowledge source block 4 in this case) is started and uses the data indicated by a pointer xxxx. For each event, the name of the knowledge source block to be started and the pointer xxxx to the data to which the knowledge source block is to use are stored in a waiting queue called the event queue. The event is selected and processed after a termination of processing of the knowledge source block currently being executed by the event selection function, so that a new knowledge source block is started after completion of the current block. The inference operation of the rule base system is performed by repetition of such processing and is controlled by the inference engine.

The knowledge source block 4 has the name defined by ksname-2" and a selection mode defined by "MULTI" and includes the rules 10 and 11 and the priority control section 7 defined by "PRIO (size, table)". The selection mode "MULTI" executes all procedure sections of all rules for which the conditions exist or are satisfied. The priority control section "PRIO" respectively designates a variable name "table" designating the priority sequence table storing the priority or sequence of rules execution, and a variable name "size" storing the size of the table. The compiler, to be discussed later, looks for these fields of the mode instruction to determine whether rule priority should be changed. The "size" and "table", because they are variables, may be designated externally, and thus the priority sequence of the evaluation of the rules can be controlled externally. Therefore, "size" corresponds to the size designating section 8, while "table" corresponds to the priority sequence table 9, where actually only the variable name is stored in the priority control section 7.

FIG. 4 is an example of the priority sequence table 9. In a case where n rules exists in the corresponding knowledge source block, the rule numbers of rules of a priority from 1 to n are stored in the priority sequence. That is, the rule numbers are stored in the order of priority. As a result of the provision of this table, the rules are executed and evaluated without relation to the arrangement sequence of the rules in the knowledge source block. Instead, they are executed and evaluated in accordance with the sequence defined in the relevant table 9 which changes the priority depending on the rule number arrangement. All rules need not be executed and the "size" can be reduced, for example, from "n" to "n−1", and, as a result, the rule with the lowest priority is masked out (for the inference engine) and evaluation of that rule is not carried out. Masking is performed sequentially on the rules in the priority sequence. In this manner, it is possible to delete a rule without changing the knowledge source block.

This process (the process achieved by the present invention) is effective, for example, in a circuit design system, where a common rule base is created for several circuit design technologies such as CMOS circuits and ECL circuits, where some rules are used for CMOS circuits but are not used for ECL circuits. Without the process described above, the rules would have to be created and stored separately for the ECL circuit and CMOS circuit. It is also necessary to generate similar knowledge sources for other circuits. Accordingly, the present invention is very effective for development efficiency because it allows unification of the rule base.

Referring back to FIG. 3, the rule 11 has a structure different from the format of "$IF ... $THEN ... " of rule 10. The rule 11 includes a plurality of selectable (detail) rules (a case type structure) and executes only one of these rules. The start and end of the procedure selecting section 12 are designated respectively by "$SELECT" and "$END-SELECT". The start and end of the procedure evaluating section 13 are designated respectively by "$EVAL" and "$END-EVAL". The start and end of the detail rule (the case type structure) are designated by "$CASE" and "$END-CASE". "MAX2" indicates that the rule having the maximum evaluation value (MAX) among cases is executed. "MIN" is of course used to designate that the rule having the minimum evaluation value is executed. The evaluation values for the procedure sections of CASE1 and CASE2 are using "var". For instance, when the evaluation value for CASE 1 is the maximum, the procedure $WHEN1 is executed. In this situation, execution of a procedure section having a different evaluation value is disabled. If all evaluation values are "0", no procedure section is executed and, as a result, the corresponding rule is not executed. If the rule selection mode of the knowledge source block to which the rule belongs is SINGLE, the next rule is evaluated and when a procedure is executed, the execution of the knowledge source block is terminated.

This processing is effective for a rule, for example, which compresses the gate of an electronic circuit as shown in FIG. 5. For example, it is assumed that the detail rules shown in FIGS. 5(A) and 5(B) are applied to produce the gate shown in FIG. 5(c). In this case, the rules 1 and 2 are satisfied and both could be executed, however, the number of inverters that are deleted is increased by one when the rule 2 is applied and rule 2 is therefore the optimum rule. However, the optimum situation may be the opposite (that is, rule 1 is the optimum), when the object of the application is changed. In this situation, optimization by an "$IF ... $THEN ... " structure would be impossible. Therefore, the two detail rules shown in FIGS. 5(A) and 5(B) may be combined into the one rule shown in FIG. 6. This rule corresponds to the rule 11 of the knowledge source block 4 shown in FIG. 4. Two detail rules are actually evaluated and the optimum detail rule is selected based on a result of the evaluation.

Figure 7:
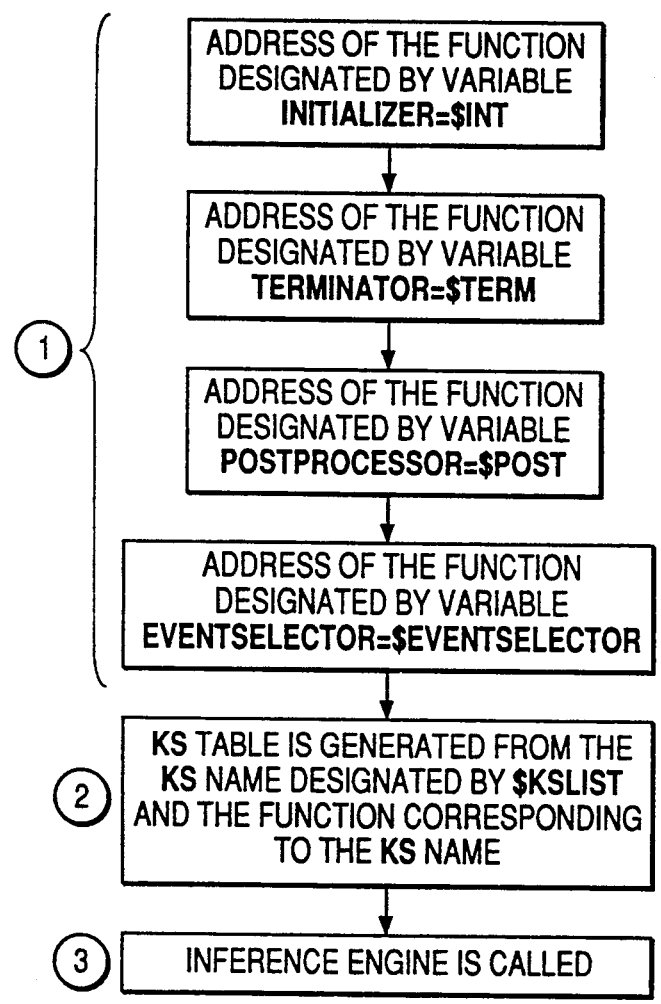
FIG. 7 translation processing flow.

The rule base source 1 in the structure explained above is translated by the rule base compiler 15 to generate a source program 16. Generation of the source program 16 will be explained with reference to FIG. 7 and FIG. 8. FIG. 7 illustrates the translation processing flow for the control block 2 by the rule base compiler 15. Namely, the function (program) having the main function name designated by "$CONTROL func_name" is generated from the "$CONTROL" or "$END-CONTROL" sentence. In step 1, each of the variables INITIALIZER, TERMINATOR, POST-PROCESSOR, EVENTSELECTOR is set as the address of the functions designated, respectively, by "$INIT init_func", "$TERM term_func", "$POST post_func", "$EVENT SELECT eventselector" definition of the control block 2. In step 2, a knowledge source table (KS table) is generated from the KS (knowledge source block) name list designated by "$KSLIST ksname-1, ksname-2. . . " and the function address corresponding thereto. This KS table lists the knowledge source blocks needed for execution by the rule base processing system or subsystem defined by the control block, and is therefore essential for processing the events in the event queue with the inference engine. In step 3, the inference engine 19 is called.

A structure of the KS table is illustrated in FIG. 8. A pointer to the start of the KS table is stored in the variable KSLIST. Moreover, each KS table includes a pointer to the next table, a name of the KS table and an address of the knowledge source corresponding to the relevant KS. This KS table may be generated from a description of the "$KSLIST" of control block 2 without retrieving the rule base source 1.

The function names for initialization and end processing are also described in the control block 2. Retrieval of the rule base source file, which has been required for generation of the main program, can be avoided by combining the information required for generation of the main program to operate the rule base with "$CONTROL $SEND-CONTROL". Namely, the knowledge source blocks are combined in the knowledge source list. As a result, since the knowledge source may be described in another file, a large scale rule base system can be maintained efficiently. Because the main program is given a name, as designated by the main function name designating section 5, the rule base system executed by the main program can be called as a subprogram.

FIG. 9 through FIG. 12 illustrate execution of knowledge source blocks (KS) 3 and 4 by the rule base compiler 15. Namely, a function or program is generated for each knowledge source block 3 or 4. The program name is equivalent to the name of the knowledge source block. Each knowledge source block generates different procedure functions depending on the rule selection mode and designation of the priority of rules. Namely, the compiler detects the instruction SINGL, MULTI, SINGL PRIO, and MULTI PRIO, and generates corresponding programs for which the flow is illustrated in FIGS. 9-12.

Figure 26:
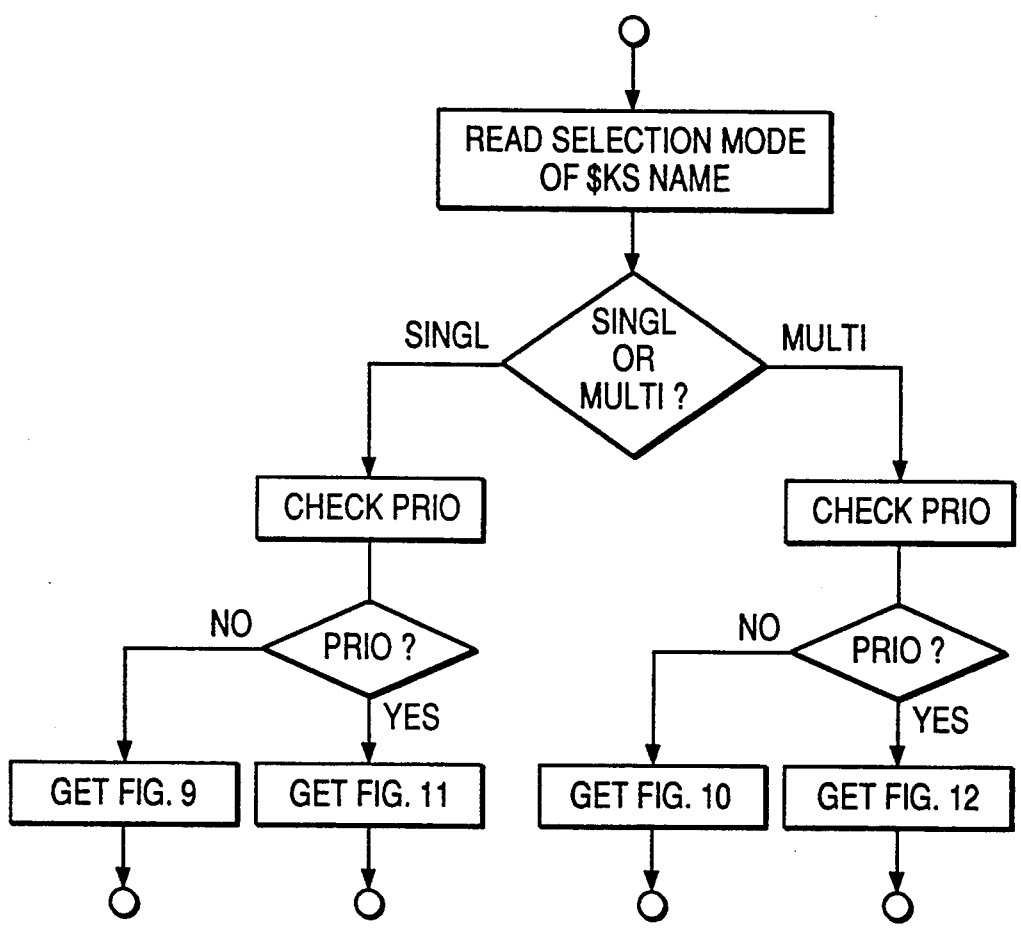
FIG. 26 is a flowchart of detection by the compiler of the selection mode and priority control in the rule base source and generation of a corresponding program.

FIG. 26 shows the flow of the compiler in detecting these instructions. The compiler reads the selection mode, for example, for the $KS line at the beginning of knowledge source block 3 in FIG. 3, and determines whether a single or multiple selection mode is designated. For example, in knowledge source block 3, a single selection mode is designated by SINGL, and in knowledge source block 4, a multiple selection mode is designated by MULTI. For either selection mode, the compiler determines whether priority control is designated. For example, in knowledge source block 4, priority control is designated by PRIO. The compiler generates a different program for each of the four possible designations: SINGL, SINGL PRIO, MULTI, and MULT PRIO.

FIGS. 9-12 show the execution flow of these instructions once detected, and will now be explained.

Figure 9:
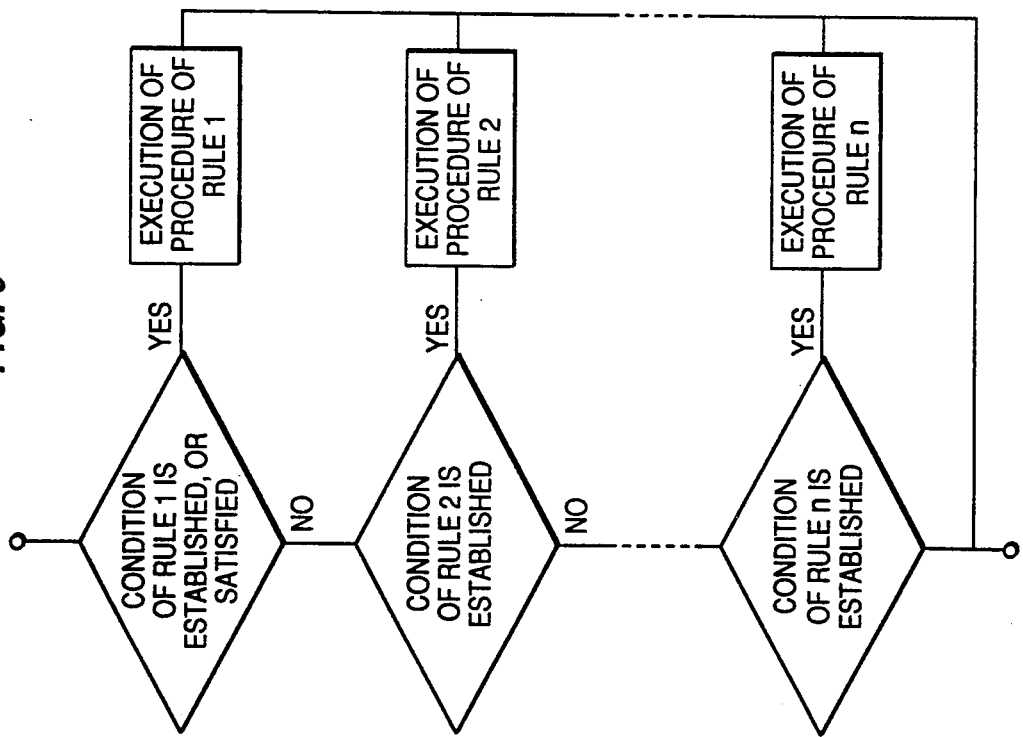

FIG. 9 shows execution processing flow where the selection mode is set to "SINGLE" and where priority control is not performed by the priority control section 7. Since priority control is not carried out, the satisfaction of the conditions of the rules is evaluated in the sequence of the rules as found in knowledge source blocks 3, 4, for example, in the sequence of rule 1, rule 2, . . . rule n. Here, since the selection mode is set to "SINGLE", when the first rule is satisfied, a function or event designed to execute the procedure of the relevant rule is generated, thus completing the processing for the knowledge source block in question.

Figure 10:
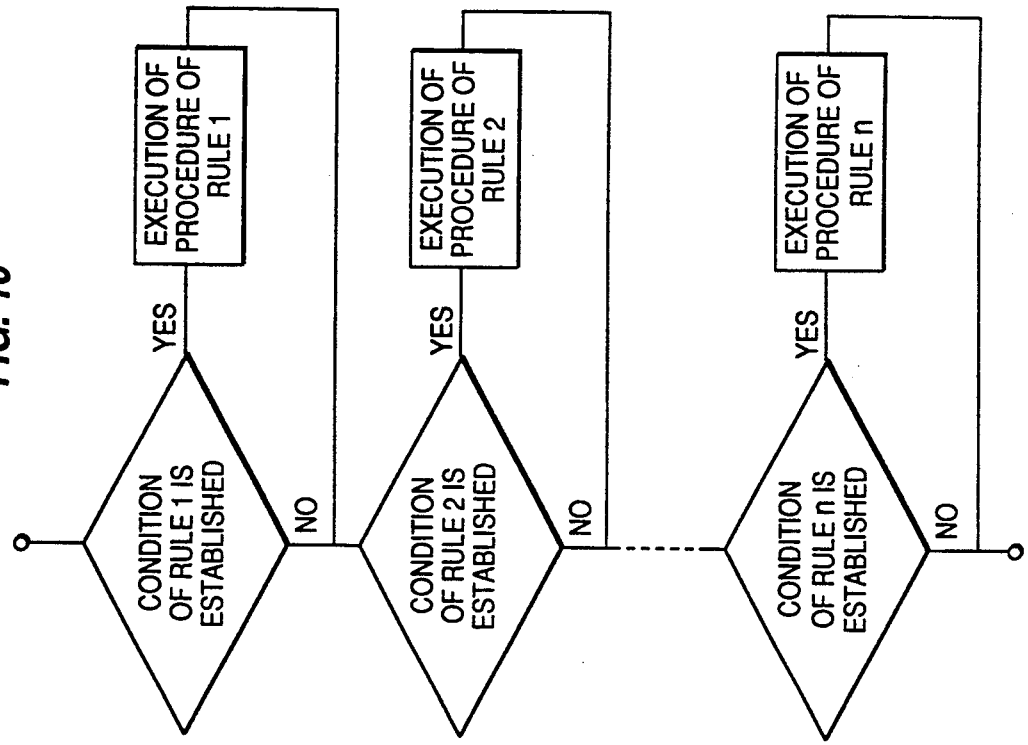
FIGS. 9 to 12 are flowcharts of a translation processing flow.

FIG. 10 shows processing flow where the selection mode is set to "MULTI" and priority control is also not performed. In this case, the evaluation sequence of rules is the same as that in FIG. 9. Since the selection mode is set to "MULTI", all rules are evaluated and the procedures of all rules for which the conditions are satisfied are executed.

Figure 11:
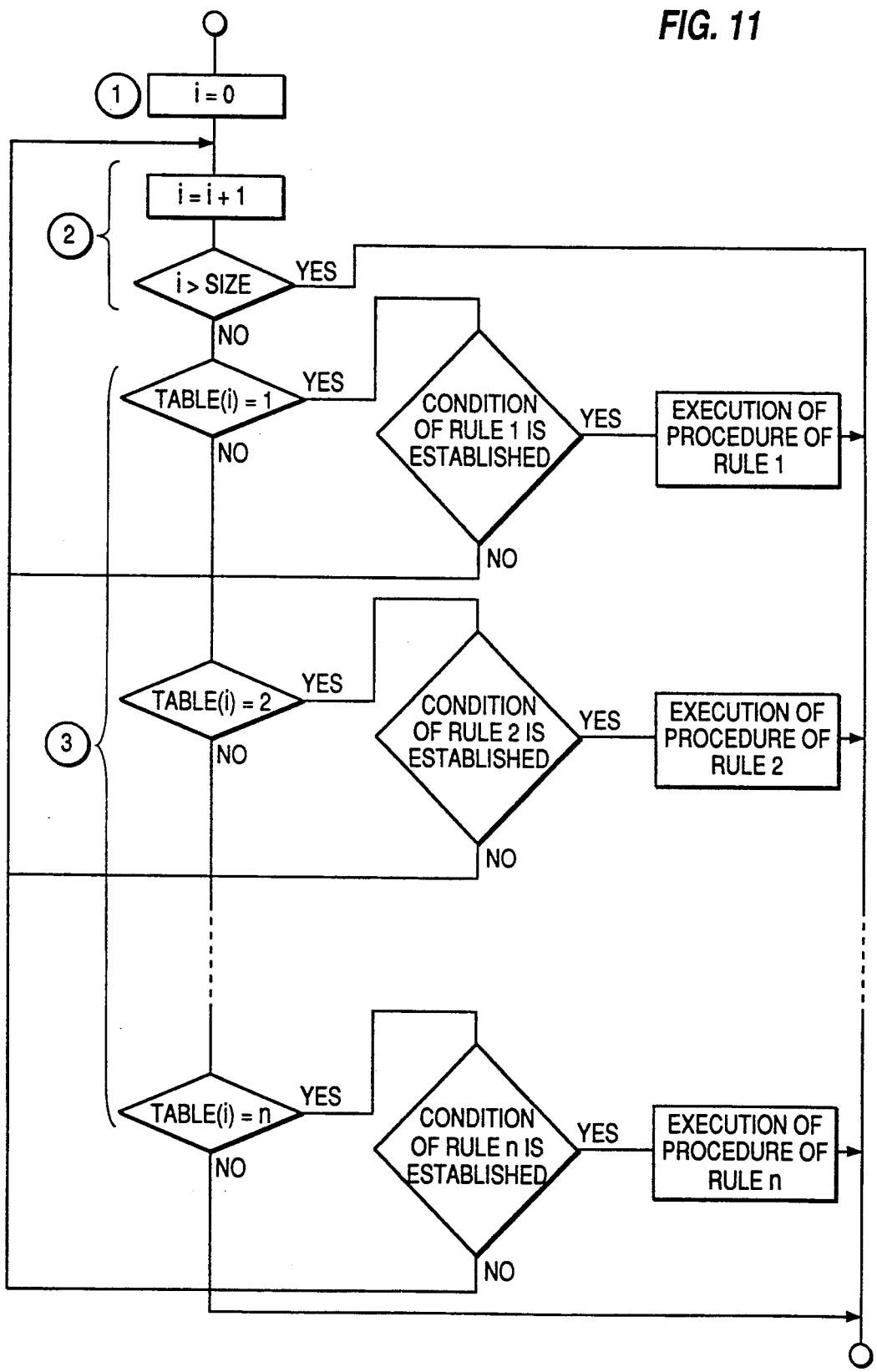

FIG. 11 illustrates a processing flow where the selection mode is set to "SINGLE" and priority control is performed by the priority control section 7. In step 1, a control variable i is cleared. In step 2, i is incremented by 1 and compared with a table size "size" designated by the size designating section 8. When i>"size", processing is completed and the remaining rules are not provided to the inference engine 19 for evaluation. In step 3, when i is not larger than "size", the rule priority in the priority sequence table 9 is determined and the highest priority rule is evaluated. When the evaluated rule is satisfied, since the selection mode is set to "SINGLE", a function or event designed to execute the procedure of the rule is generated, completing the processing. When the evaluated rule is not satisfied, the processing after step 2 is repeated.

Figure 12:
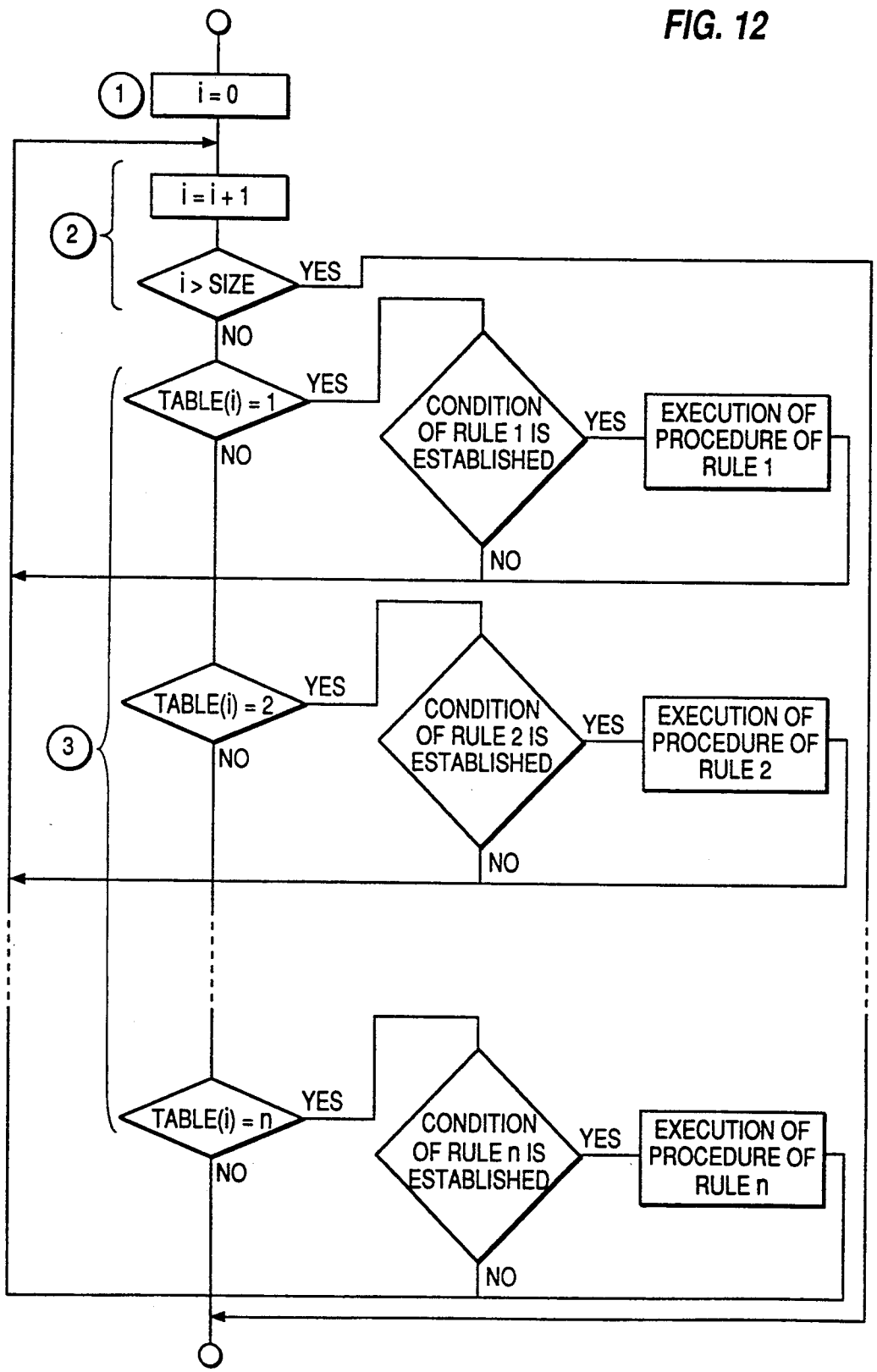

FIG. 12 shows an execution flow where the selection mode is set to "MULTI" and the priority sequence is controlled by the priority control section 7. The processing steps 1 and 2 are executed as in the case of FIG. 11. In processing step 3, however, since the selection mode is set to "MULTI", a function or event for executing the procedure of rules in which the conditions are satisfied or established is generated, so that rule evaluation is also performed for all rules for which i is not larger than "size".

The inference engine 19 performs an inference as explained with reference to FIG. 13 and FIG. 14 with the above operation being performed when the knowledge sources are executed.

Figure 13:
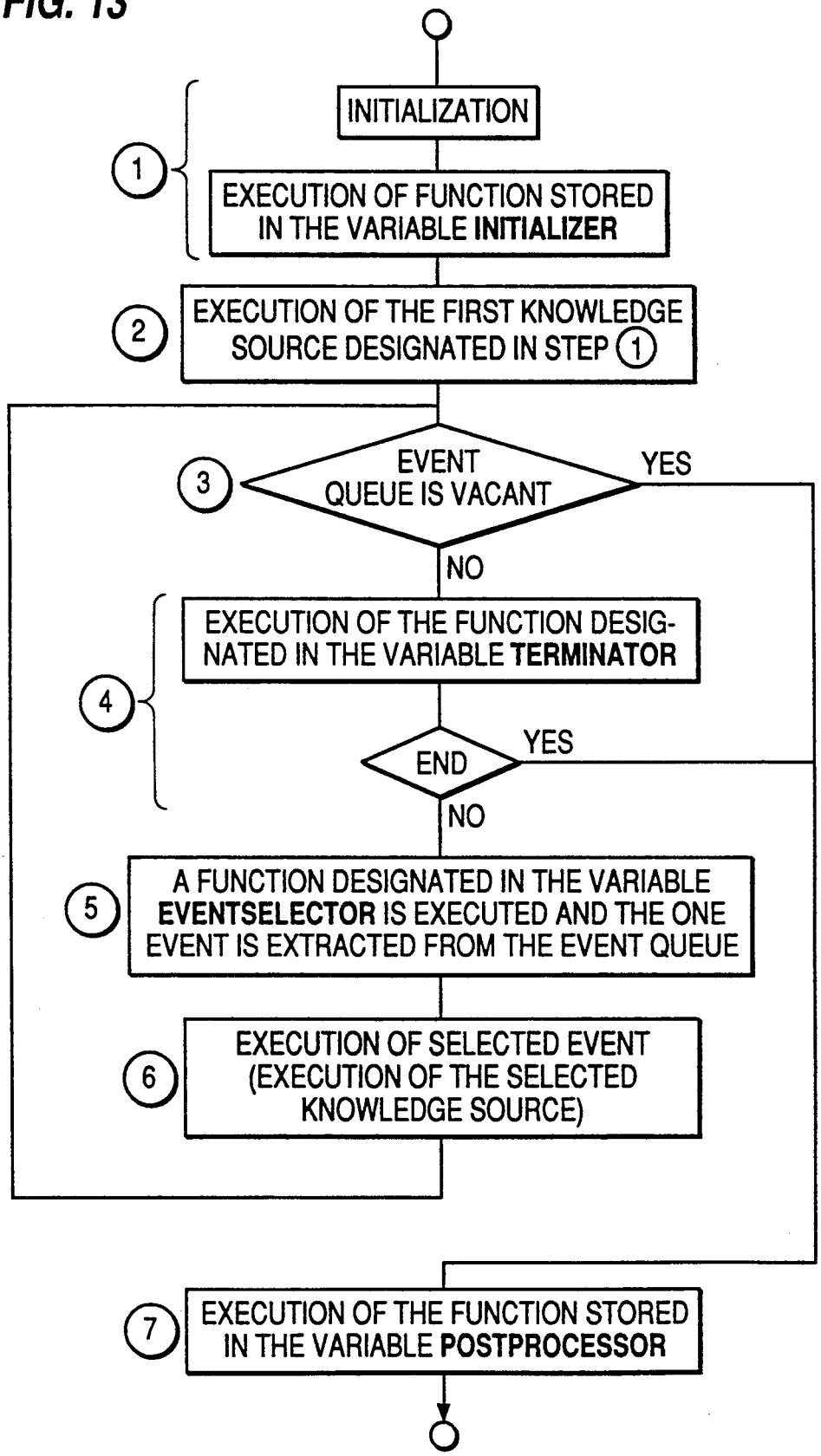
FIG. 13 is a flowcharts of inference flow.

FIG. 13 indicates an inference processing flow to be conducted by the inference engine 19 and will be explained in terms of executing the program example in FIG. 3. In step 1, after first executing the initialization operation, such as clearing the event queue, a function or routine with the address stored in the variable INITIALIZER of the source program 16 is called. This function designates the name of the first knowledge source block to be executed, which in FIG. 3 is knowledge source block 3, and returns control to the inference engine 19. In step 2, the KS table is retrieved and knowledge source block 3, in this case, is obtained and the address of the function corresponding thereto is called. Here, the knowledge source block 3 is executed first and then issues, or generates, a next event to be executed. Namely, knowledge source block 3 includes designating the "PROPOSE" event which causes the execution of another knowledge source block. The called function executes the processing in accordance therewith and stores an event in the event queue depending on the processing of the "PROPOSE". Here, a structure of the event queue is shown in FIG. 14. The address of the first event queue table entry is stored in the variable EVENTLIST. In addition, each entry stores a pointer to (address of) the next entry, the name of the knowledge source (block) to be executed and the data to become an argument. In step 3, it is determined whether there is an event in the event queue. When the event queue is vacant, predetermined end processing or termination processing is performed. In step 4, when the event queue is not vacant, a function or program of which the address is stored in the variable TERMINATOR is called. The TERMINATOR function is a conventional function and exists in, for example, ESHELL. The called function determines whether the inference should be terminated or not. When the inference should be terminated, termination processing is carried out. In step 5, when the inference is not terminated, a function or program designated in the variable EVENTSELECTOR is called and uses a pointer to extract the event to be processed next from the event queue. The EVENTSELECTOR function selects, for example, the first or last event in the event queue, or the first or last issued event in the event queue having specific data. For example, in FIG. 14 the variable EVENTLIST points to the last issued event in the event table. In step 6, the KS table is searched using the name of the knowledge source found in the event table entry the event to be executed to obtain the address of the knowledge source to be started. The function, or source, is then called or retrieved and executed using the data stored in the event table entry as an argument. Hereinafter the processing steps 3 through 6 are repeated until the event queue is vacant or until the end of the inference is indicated.

In step 7, to terminate processing, a function designated in the variable POSTPROCESSOR is called and the inference is terminated by executing the process for termination. The POSTPROCESSOR function is conventional and exists in, for example, ESHELL.

As explained above, according to the preferred embodiment of the present invention, a large scale rule base which is easy to maintain can be realized. The relevant rule base can be called as a subsystem by providing a function name designating section to the control block in the rule base system structure processing of the system in which the rule base source is translated by the rule base compiler. The evaluation sequence of rules may be changed without changing the rule base and optimum processing may be realized by providing the priority control section in each knowledge source block.

In a second embodiment of the present invention, a description of the external control of the evaluation sequence of the rules is provided so that it is possible to change the order of priority of the rules. An example will now be explained wherein processing, such as the selection of a circuit element, is performed by providing access to the rule base data from a terminal in the computer system providing the rule base data.

Figure 15:
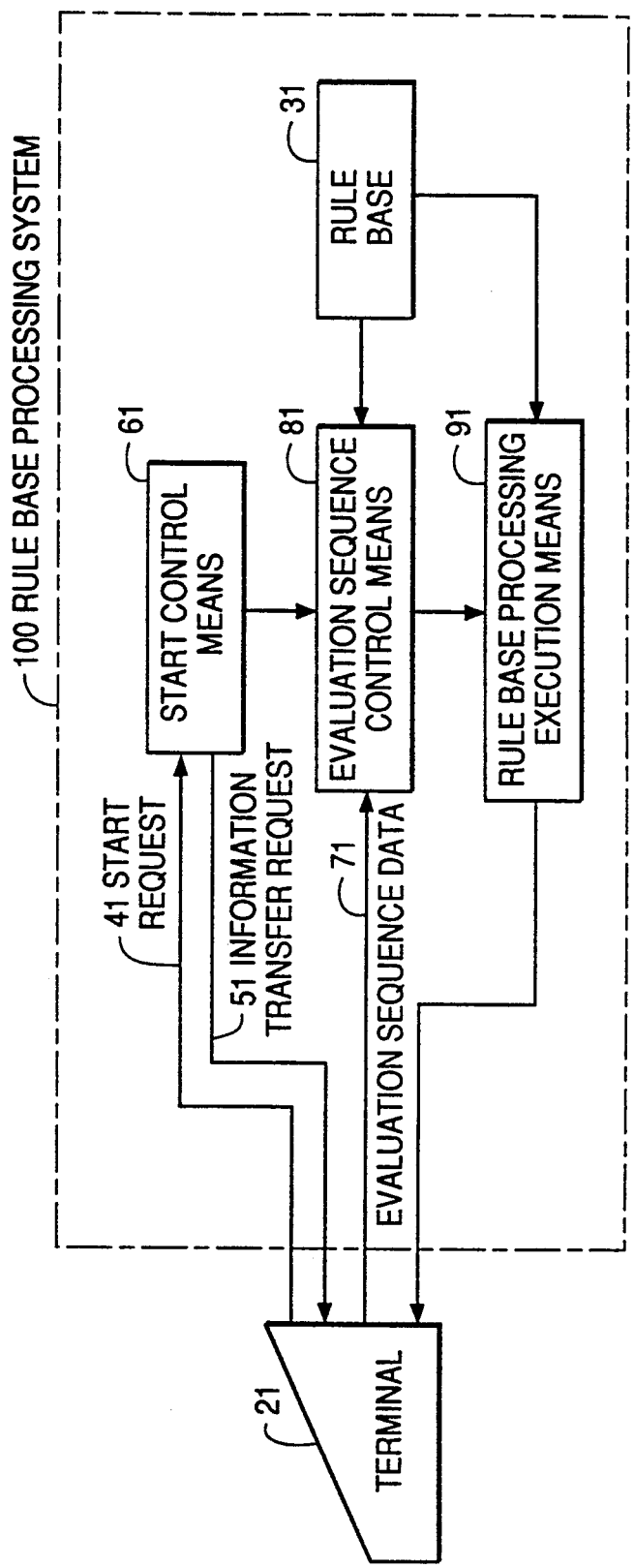
FIG. 15 is a schematic diagram of a system structure of the present invention.

As shown in FIG. 15, the present invention executes rule base processing by creating (starting) a rule base 31 provided in the rule base processing system 100 through a terminal 21 connected to the rule base processing system 100.

The start control means 61 receives a rule base starting request 41 sent from the terminal 21 and outputs an information transfer (send/receive) request 51 to the terminal requesting that information in regard to the evaluation sequence is to be input to the rule base processing system 100.

An evaluation sequence control (input) means 81 inputs evaluation sequence data 71 output from the terminal, and controls the evaluation sequence of rules in the rule base based on such data.

A rule base process executing means 91 applies the rules in conformity with the evaluation sequence of rules controlled by said evaluation sequence control means 81, executes the evaluation and procedure and then outputs the result to the terminal 21.

A user first inputs a start request 41, to create rule base 31, to the rule base processing system 100 from the terminal 21. The start request is received by a start control means 61. The start control means then returns, to the terminal means, the information transfer send/receive request 51. Input can then be made regarding which sequence the rules in the rule base are to be applied and what rule base processing is carried out based on the evaluation and procedure of the condition part.

A user receives the information transfer request and gives the evaluation sequence data to the rule base processing system. This evaluation sequence data is the information that indicates the execution sequence of the rules. Namely, the data is either a rule number train, arranging the rule numbers provided for each rule in the rule base in the sequence of execution, or an application condition for rule base processing. If an application condition is indicated, it is required as a precondition that rule executing sequence data (a rule number train) suitable for that application condition is already stored in the rule base processing system. In such a case, the user has been previously requested to store, in the rule base processing system, the condition for applying the rule base processing and the rule number train suitable for that application.

The evaluation sequence control means receives this evaluation sequence data. The evaluation sequence control means arranges the sequence of the rules in the rule base in accordance with the evaluation sequence data and outputs the rules arranged in the execution sequence to a rule processing executing means. Here, in a case where the evaluation sequence data indicates the rule number train itself, the rules are extracted from the rule base in accordance with the number train and then arranged in the execution sequence. On the other hand, if the evaluation sequence data does not indicate the rule number sequence, but rather indicates the application condition, the evaluation sequence control means references the rule number sequence already stored, extracts rules from the rule base in accordance with the sequence thereof and arranges the rules in the execution sequence. The rule base processing executing means 91 executes the rule base processing in the sequence of rules arranged by the evaluation sequence control means 81 and outputs the result to the terminal 21.

Figure 19B:
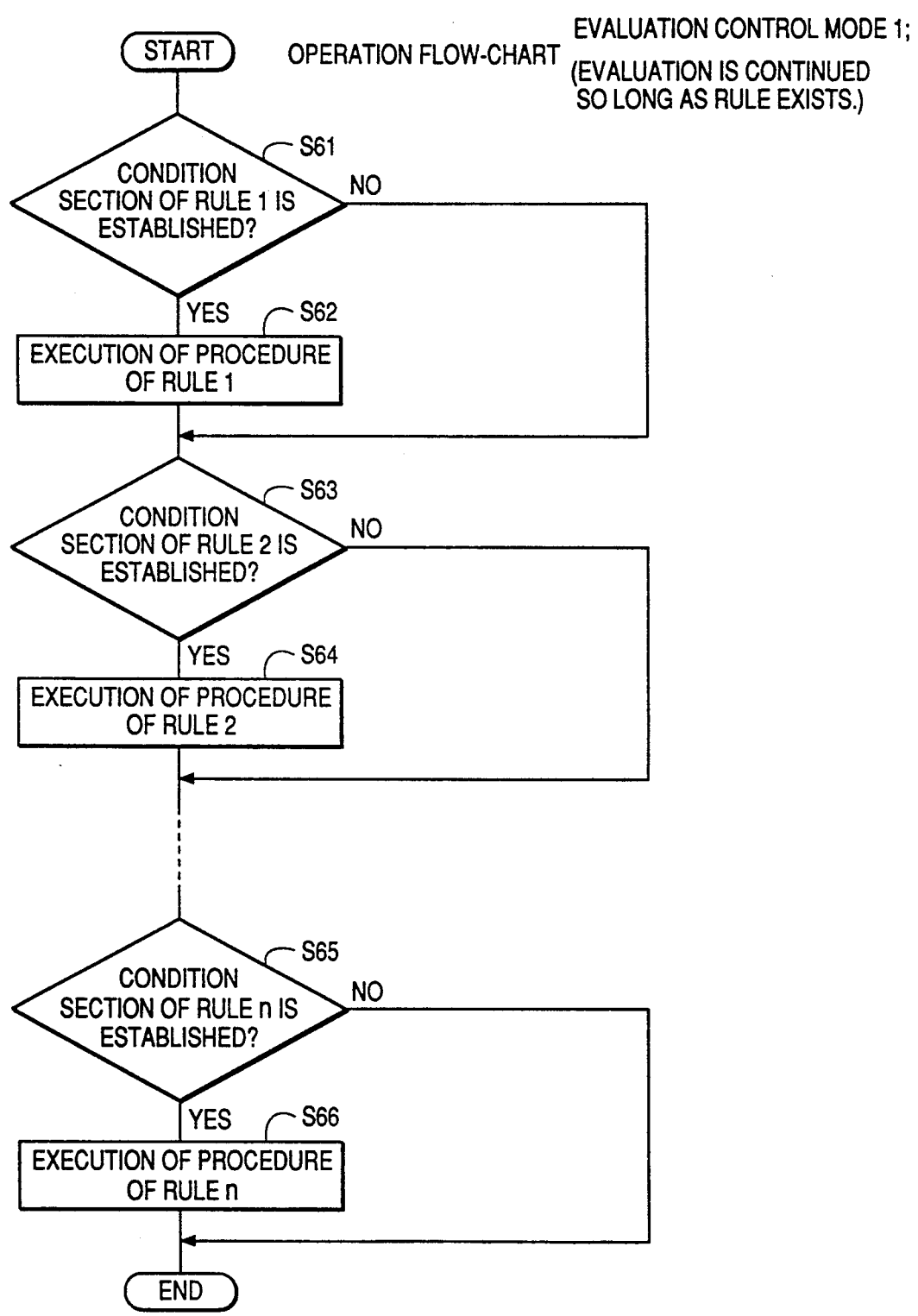
FIG. 19B shows operation flow of the conventional rule base.

FIG. 19A and FIG. 19B are diagrams for explaining the structure (FIG. 19A) and operation (FIG. 19B) of the rule base in the rule base processing system. A rule base, as previously discussed, is composed of a plurality of rules (rule 1, rule 2, . . . , rule n) (FIG. 19A). Each rule is composed of a condition section and a procedure section. During the rule base processing, the conditions in the condition section are evaluated sequentially starting with the first rule (rule 1) in the rule base. When the condition is established or satisfied, the procedure in the procedure section of the rule is executed. When the condition is not satisfied, the condition section of the next rule is evaluated. For instance, when the condition of rule 1 is satisfied, the procedure of rule 1 is executed, and when the condition is not satisfied, the next rule 2 is processed and the condition section of rule 2 is evaluated. In this case, the rule base processing may be controlled by either the evaluation control method, or the selection method as explained previously. In one evaluation control method (evaluation control mode 1; MULTI), evaluation of the condition and execution of the procedures are repeated as long as there are rules in the rule base which have conditions satisfied by the data. According to this control method, the procedures of all the rules for which the conditions are satisfied are executed. In the other method (evaluation control mode 2; SINGLE), when the first rule for which the condition is satisfied is found, the procedure of this rule is executed and the processing is completed. According to this control method, only the procedure of the first rule for which the condition is satisfied is executed, and even if there are other rules for which the conditions are satisfied, processing is not carried out for those rules.

FIG. 19B is an operation flowchart of rule base processing in the evaluation control mode 1 (evaluation of condition is continued so long as there are rules which satisfy the condition). First, an evaluation as to whether the condition section of the leading or first rule 1 of the rule base is satisfied or established is determined (S61). When satisfied (yes), the procedure of rule 1 is executed (S62). When not satisfied (no), the next rule (rule 2) is processed ($S63). In the step S63, an evaluation as to whether the condition section of the rule 2 is satisfied or not is performed, as in the case of rule 1. When satisfied (yes), the procedure of rule 2 is executed (S64), but when not satisfied (no), the next rule (rule 3) is processed, skipping step S64. Thereafter, evaluation of the condition and execution of the procedure are sequentially repeated as in steps S61 though S64, for each rule in the rule base, and processing is continued until the last rule (rule n) is processed. When not satisfied, the rule base processing is terminated (END). When satisfied (yes), processing is terminated after execution (S66) of the procedure of rule n. In the evaluation control mode 2 subsequent rules are not evaluated if there are rules for which the one condition section is established, and the rule base processing is terminated (END) when execution of the procedure (for example, S62, S64, S66) of a satisfied rule is completed.

Figures 20A, 20B, 20C:
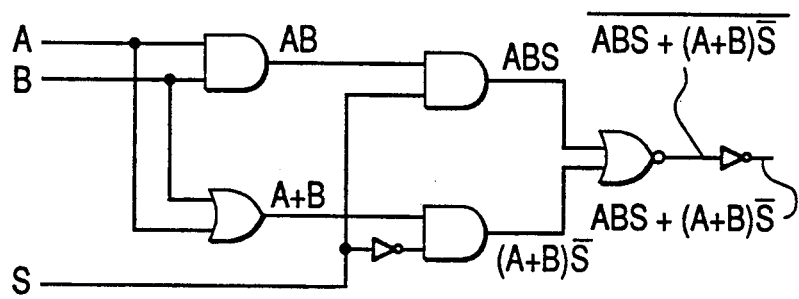
FIG. 20A explains a rule base of LSI circuit design and description of the function level.
FIG. 20B is a diagram for explaining a logic level description.
FIG. 20C is a diagram explaining an example of a circuit diagram.
Figure 20D:
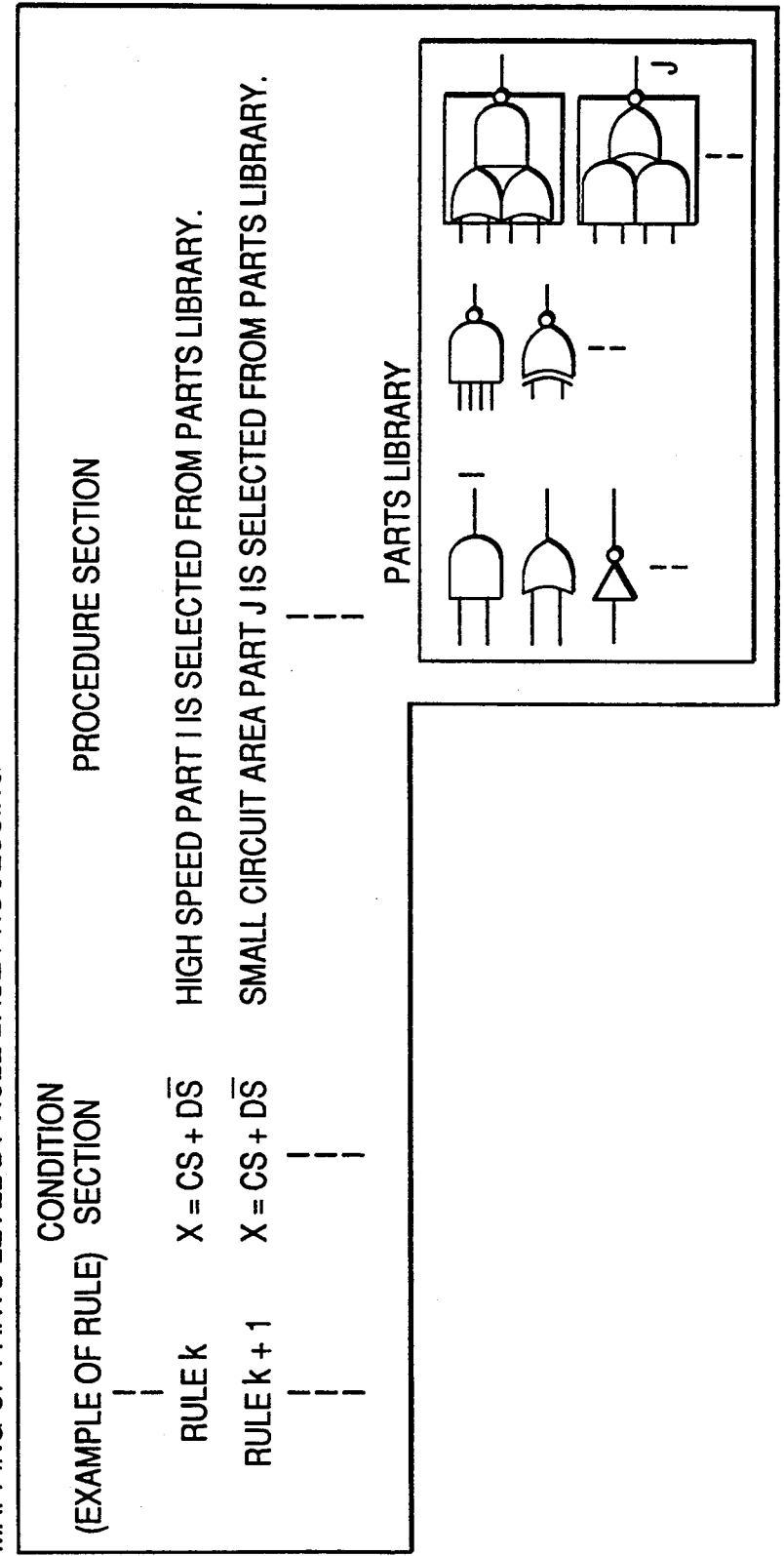
FIG. 20D is a mapping of the part level in accordance with rule base processing.

One application of rule base processing explained above is an design of LSI circuit. FIGS. 20A through 20F are diagrams explaining application of rule base processing to the LSI circuit design. The function is first described (FIG. 20A) and then translated into a logic description (FIG. 20B). Thereafter, a mapping of parts is carried out (FIG. 20D). The rule base processing is applied in the actual mapping of parts from the logic description. For example, in the design of a circuit in which when inputs A, B, C are applied to a circuit 1 and S is 1, A*B (AND of A and B) appears at the output X and when S is not 1, A+B (OR of A and B) appears at the output X. First the functions of FIG. 20A are described using a description language. It is then translated to the description at the logic level as shown in FIG. 20B. Currently, conventional software exists for automatically converting the function description into a description of the logic. In this situation, the circuit described by the description of FIG. 20A and FIG. 20B is converted to that shown in FIG. 20C. The circuit may be formed by three AND circuits, an OR circuit, a NOR circuit and two inverters. The processing for converting a description at the logic level into a combination of such parts is conducted using the rule base processing. In this case, the parts may include many kinds, for example, high speed parts (short delay time), parts which require a small circuit area and parts providing a plurality of gates, etc. A list of the parts which may be incorporated into LSI circuits is stored in a part library.

FIG. 20D shows an example of the mapping at the parts level as performed by the rule base processing. The logic is replaced with parts, one by one, by the rule base processing. FIG. 20D briefly illustrates an example of the rule for mapping the parts for the circuit of X+CS+DS where AB is replaced with C and A+B is replaced with D in X=ABS+(A+B) S of FIG. 20B. The parts mapping of X=CS+DS is conducted for the rules k and rule k+1 among many rules in the rule base. Although both rules share the condition section indicated by X=CS+DS, the procedure section is different. The procedure of rule k satisfies X=CS+DS from the part library and selects a high speed part I, while the rule k+1 selects a part J which requires only a small circuit area.

During application of the rule base to the LSI circuit design, many rules having the same condition section but different procedure sections exist because many kinds of semiconductor design techniques have been proposed. In the circuit designs of CMOS, LSI, and ECL LSI, different parts must be used even when the circuit is designed using the same logic description. For instance, in a CMOS design, parts which require a small circuit area are used, while for ECL circuits, parts with a short delay time are used. For these cases, a number of rules having the same condition section and a different procedure section are prepared, as shown in FIG. 20D, and stored in the rule base.

In conventionally executing the rule base processing of FIG. 20D, evaluation of the conditions and execution of the procedures are sequentially performed starting with further leading rule (rule 1). The rule k+1 is not executed until the end of execution of the condition evaluating and procedure of rule k. In the evaluation control mode 1 rule conditions are continuously evaluated so long as the rules exist which satisfy the condition and the rule k+1 is executed after execution of rule k. In the evaluation control mode 2, however, evaluation of subsequent rules is not performed and if there is encountered a rule for which the condition is satisfied, and when the condition of rule k is established, procedure of rule k is executed and the rule base processing terminates. Therefore, rule k+1 is not executed.

Problems can occur when the sequence of evaluation of the rules is not specified. Where it is desired to design the circuit of X=CS+DS with high speed parts, the high speed parts I are selected by executing the rule k. Where it is desired to design the circuit of X=CS+DS with parts which require small circuit area, however, the rule k is also executed first and X=CS+DS is satisfied with the condition section of rule k. Therefore, the high speed parts I are selected and the parts J which require small circuit area are not selected even though desired. Since this problem sometimes occurs, the sequence for evaluating the rules is very important.

Figure 20E:
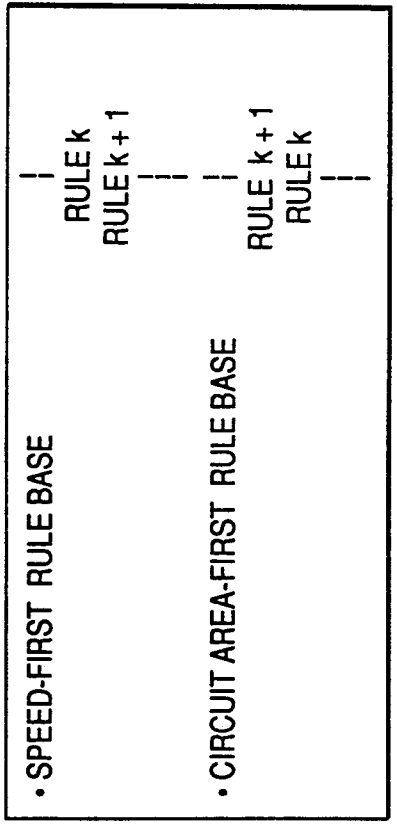
FIG. 20E is a diagram for explaining an example of the rule base.
Figure 20F:
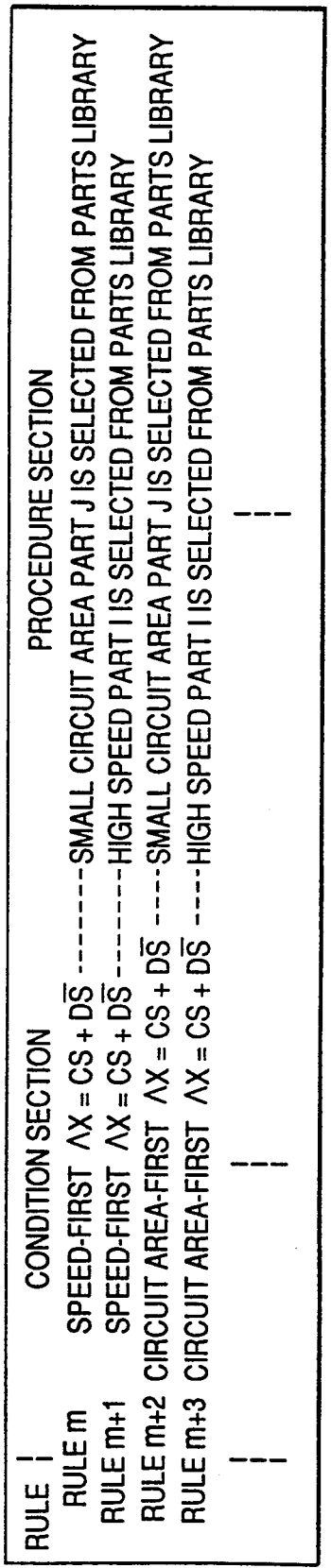
FIG. 20F is a diagram for explaining another example of the rule base.
Figure 22B:
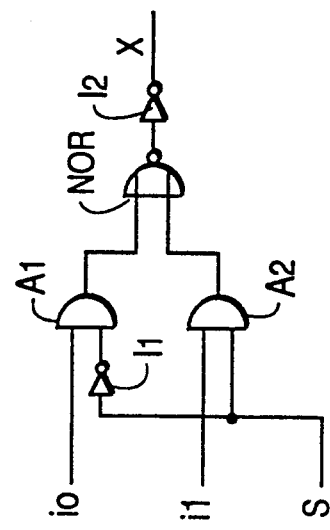
FIGS. 22A and 22B are examples of two inputs in the present invention.

In the conventional rule base processing system, rule bases such as shown in FIG. 20E and FIG. 20F are developed to solve this problem. As shown in FIG. 20E, the rule bases are separate, so that the rule base selecting the high speed parts and the rule base selecting the parts which require small circuit area must be selected by the user based on the application. The speed-first rule base arranges the rules in the sequence of k, k+1 and selects the high speed parts using the rule k, while the area-first rule base arranges the rules in the reverse sequence of k+1, k and selects the parts which require small circuit area. In another conventional method, as shown in FIG. 20F, a condition for placing emphasis on the speed or circuit area is added to the condition section of rule. When circuit area is the design criteria, the speed-first rules satisfying X=CS+DS and the speed first conditions of the rules m, m+1 are not satisfied, but the condition section of rule m+2 is satisfied first to select the parts J which requires small circuit area.

In the prior art, the rule base processing is executed correctly when the rule base for each algorithmic condition has added thereto the application condition. However, the structure of the prior art results in a problem. It is necessary to generate a rule base in which rules are arranged in a different sequence for each application condition or add to each rule the application condition, as a result, the scale of the rule base becomes large, structure of the rule base is complicated and development efficiency is degraded.

The second embodiment of the present invention also solves this problem and the embodiment explained previously based on FIG. 15 will be explained in more detail below.

Figure 16:
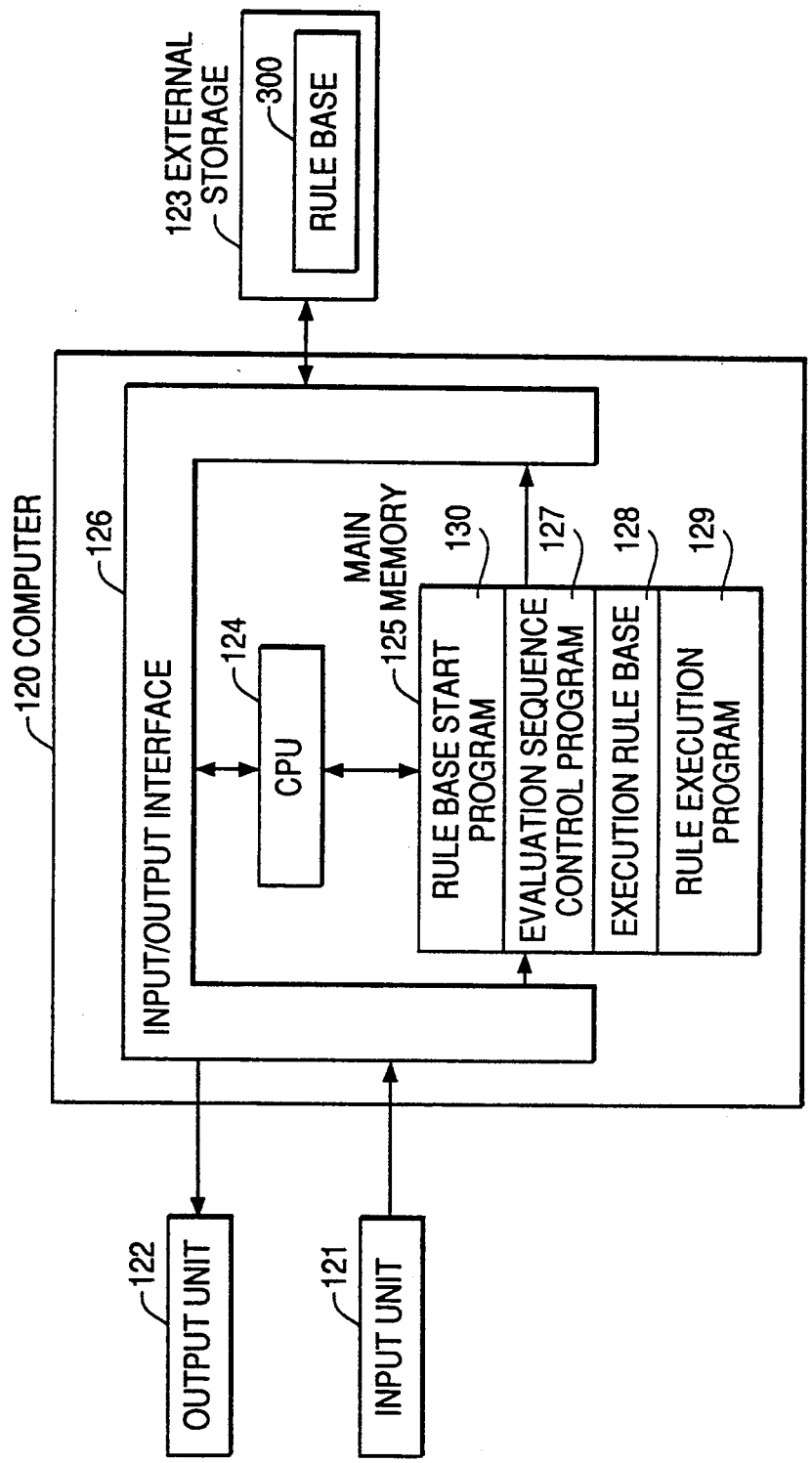
FIG. 16 is a system structure of a second embodiment of the present invention.

FIG. 16 is a diagram indicating a system structure of the preferred embodiment of the present invention. The execution of the rule base may be executed by a computer system 120 such as a general purpose large scale computer system. The computer system 120 is connected to an input unit 121 such as keyboard, an output unit 122 such as display or printer and an external storage device 123 such as a hard disk unit. The computer 120 is composed of a CPU 124, main storage 125 and input/output interface 126. The input unit 121 and an output unit 122 are connected to the computer 120 via the input/output interface 126. CPU 124 executes processing in accordance with the program and data stored in the main memory 125. In this embodiment, the rule base 300 is stored in the external storage 123, the rules are executed in the sequence in accordance with the evaluation sequence control program 127 for the rules stored in the main storage 125 and the rule base processing is executed in accordance with the rule execution program 129 in the main storage 125.

First, a user inputs a request for starting the rule base 300 to the computer 120 from an input unit 121. This request is input to CPU 124 though an input/output interface 126 and CPU 124 starts the rule base processing in accordance with the rule base start program 130 stored in the main memory. A message requesting the evaluation sequence for the rules from the user is output to the output unit 122 through the input/output interface 126. Upon receipt of this message, a user inputs the evaluation sequence data 71 (FIG. 15) to the computer 120 from the input unit 121. After receiving this input, the evaluation sequence control program 127 controls the evaluation sequence of the rules on the basis of the input evaluation sequence data 72. The rules are extracted from the rules stored in the external storage 123 based on the evaluation sequence data 71 and stored sequentially in the execution rule base 128. After generation of the execution rule base 128, the rule execution program 129 processes the rules one by one starting with the stored in the execution rule base 128. Namely, the condition section of each rule is evaluated, the procedure section of this rule is then executed when the condition is satisfied and if the condition is not satisfied, the condition of the next rule is evaluated. In an evaluation control mode where evaluation is continued as long as the rules exist unevaluated, the condition section of rules in the execution rule base 128 is evaluated and the procedure section of the rule for which the condition is satisfied is executed. However, in an evaluation control mode where an evaluation is not carried out for the subsequent rules when a rule for which a condition is satisfied is found, evaluation is sequentially carried out starting with the leading or first rule stored in the execution rule base 128 until a condition satisfying rule is encountered, the procedure section of that rule is executed, thereby completing the rule processing. Finally, the rule execution program 129 outputs the result of the rule base processing to the output unit 122 via the input/output interface 126.

A structure of the rule base 300, the operations of the evaluation sequence control program 137 and rule execution program 129, will be explained with reference to FIG. 17A and FIG. 17B. FIG. 17A shows the arrangement of the rule base 300 stored in the external storage 123, and the evaluation sequence data 71 input from the input unit 121. The rule base is composed of a plurality of rules (rule 1, rule 2, llll, rule n). Each rule is composed of the condition for executing the procedure of the rule, and the procedure to be executed when the condition is satisfied. The evaluation sequence data 71 takes a format of sequential data SEQ [i] (i=1, 2, ..., n). SEQ [i] is the number of i-th rule to be applied. For example, when the rule to be applied first is rule 6, it is expressed as SEQ[1]=6. The evaluation control mode may be classified as either the mode where evaluation is continued so long as the rules exist unevaluated, evaluation control mode 1, or the mode where evaluation is not continued for the subsequent rules when a rule for which the condition section is satisfied is encountered, evaluation control mode 2.

FIG. 17B is an operation flowchart for evaluation control mode 1. First, after the sequence variable is initialized to indicate that the evaluation sequence is set to the initial value 0 (S30), the value of i is incremented by one (1) (S31). Here, the value i becomes 1 which indicates the first rule in the evaluation sequence. Next, it is determined whether the value of i is less than the number of rules in the rule base (S32). If the value of i is larger than n (no), evaluation of all rules has been completed, ending the process (END). When the value of i is less than n (yes), the rule number of the rule in the i-the position of the sequence is determined. First, it is decided whether the i-th application rule is rule 1 or not (S33). When rule 1 is the correct rule (yes), it is evaluated to determine whether the condition section of rule 1 is satisfied nor not (S34). When satisfied (yes), the procedure of rule 1 is executed, completing the i-th rule application and the (i+1)th processing (S31) is started. When the condition of rule 1 is not satisfied (no) (S34), the (i+1)th processing (S31) is started. When the i-th application rule is not rule 1 (no) (S33), it is determined whether the i-th sequence rule is rule 2 or not (S36). When the i-th sequence rule is rule 2 (yes), it is determined whether the condition section is satisfied or not (S37). When satisfied (yes), the procedure of rule 2 is executed (S32). When not satisfied (no)(S37), the (i+1)th processing (S31) is started. When the i-th application rule is not rule 2 (no)(S36), the i-th application rule is evaluated in such a manner that it determined whether it is rule 3 or not and when it is not rule 3, whether it is rule 4 or not, etc. Finally, it is determined whether the i-th application or sequence rule is rule n or not (S39). When it is rule n (yes), it is determined whether the condition section of rule n is established nor (S40). If the i-th rule is not rule n (n)(S39), it is indicated that an error exists in the designation of the number of the i-th rule namely, a value of SEQ[i] is not a value in the range from 1 to n. In this case, the processing may be ended irregularly (END) or the (i+1)th rule processing (S31) may be started without evaluation of the i-th rule. Where the condition section of i-th application rule n is satisfied (yes) (S40), the procedure section of rule n is executed (S41), and when the condition is not satisfied (no), the (i+1)th rule processing S(31) is started.

Since the evaluation control mode is in the mode 1 (evaluation is continued as long as the rules exist) in the flowchart (FIG. 17B), the rules for which the condition is satisfied are searched for even after the first procedure is executed. For the evaluation control mode 2 (evaluation is not continued for the subsequent rules after a rule for which the condition is found satisfied), all processing must end (END) when execution of the procedure, for example, (S35, S38 in FIG. 17B) is completed.

Figure 18B:
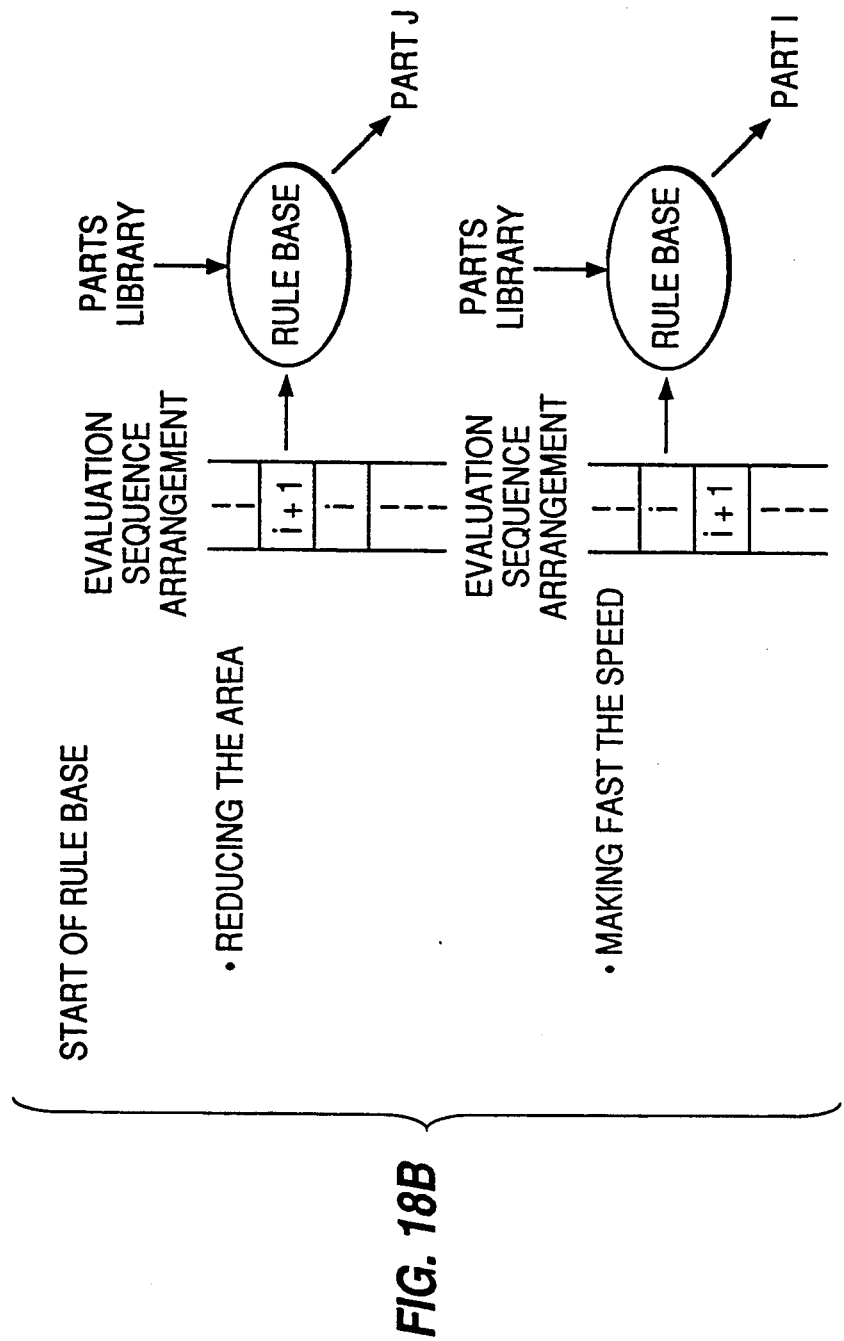
FIG. 18B is a diagram of an example for starting of the rule base in the present invention.

FIG. 18A and FIG. 18B are diagrams for explaining an example where the method of this preferred embodiment is applied to LSI circuit design. The rules for mapping the circuit description at the logic level to the actual parts are summarized in the rule base (FIG. 18A). Here, it is assumed that there are two rules for mapping the circuit description $X=CS+DS$ of the logic level to the parts (rule i and rule $i+1$). The rule i is used for selecting the high speed parts, while the rule $i+1$ for selecting the parts which require small circuit area. When it is desired to select the parts which require a small circuit area as part of an LSI design requirement, the evaluation sequence for applying the rule $i+1$ preceding the rule i is provided externally to the rule base (see FIG. 18B). Since the rule $i+1$ is applied first, $X=CS+DS$ is satisfied and the parts J which require a small circuit area are selected. On the other hand, when the high speed operation is desired, the evaluation sequence is arranged so that the rule i is applied prior to the rule $i+1$. As explained above, the data indicating the evaluation sequence is supplied externally to change the evaluation sequence of the rule base. Thereby, the processing may be executed correctly even for a rule base including the rules having the same condition section but different procedure sections.

Figure 18C:
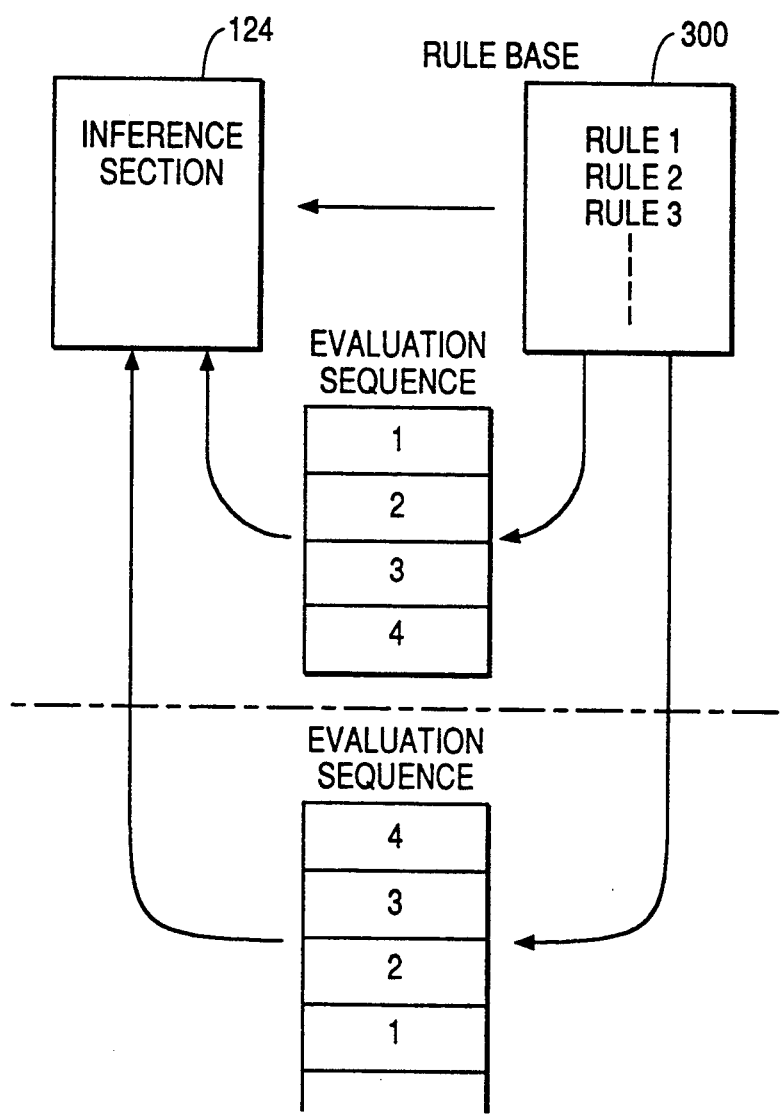
FIG. 18C is a diagram indicating the relationship between the inference engine and the rule base in the present invention.

FIG. 18C is a diagram for explaining the another embodiment of the present invention. The inference section 124 of the rule base system of the present invention (CPU in FIG. 16) does not process in accordance with the arrangement of the rule base 300, but the evaluation sequence table is used for extracting the sequence the rules from the rule base in accordance with the registration sequence in the table. In FIG. 18C, the example in the upper section indicates that the rules 1, 2, 3, 4 are executed in the stored sequence while the example in the lower section indicates that the rules 4, 3, 2, 1 are executed in the reverse of the stored sequence. Plural evaluation sequence tables are provided and it is no longer necessary to change the content of the table on a case by case basis and the user can merely select the table to be used.

Figure 21:
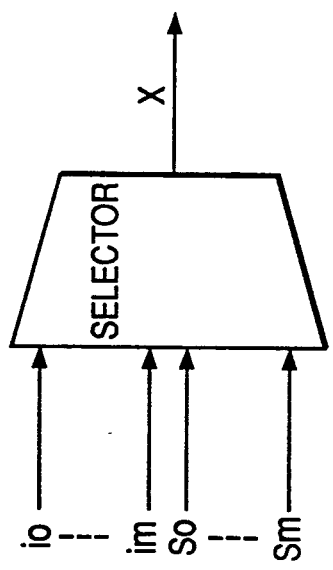
FIG. 21 is a circuit diagram to which the present invention is applied, as an example, to a selector circuit.
Figure 22A:
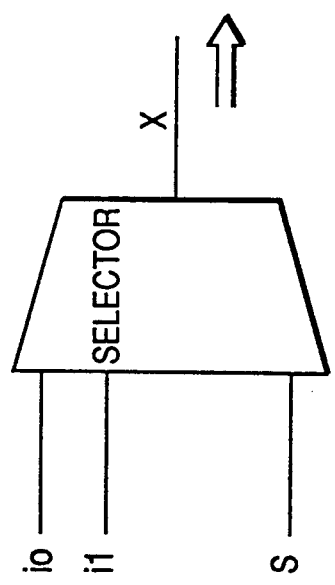
Figure 23A:
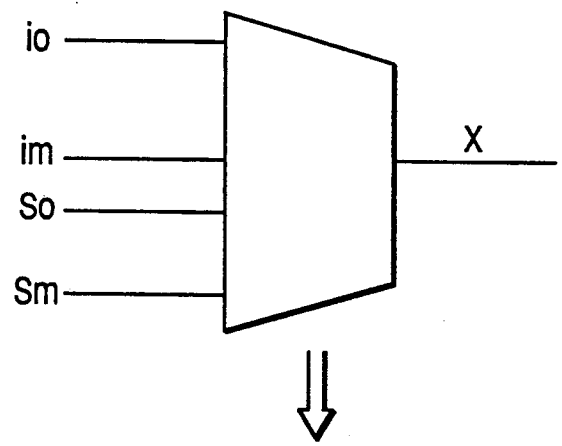
FIGS. 23A and 23B are examples of m inputs in the present invention.
Figure 23B:
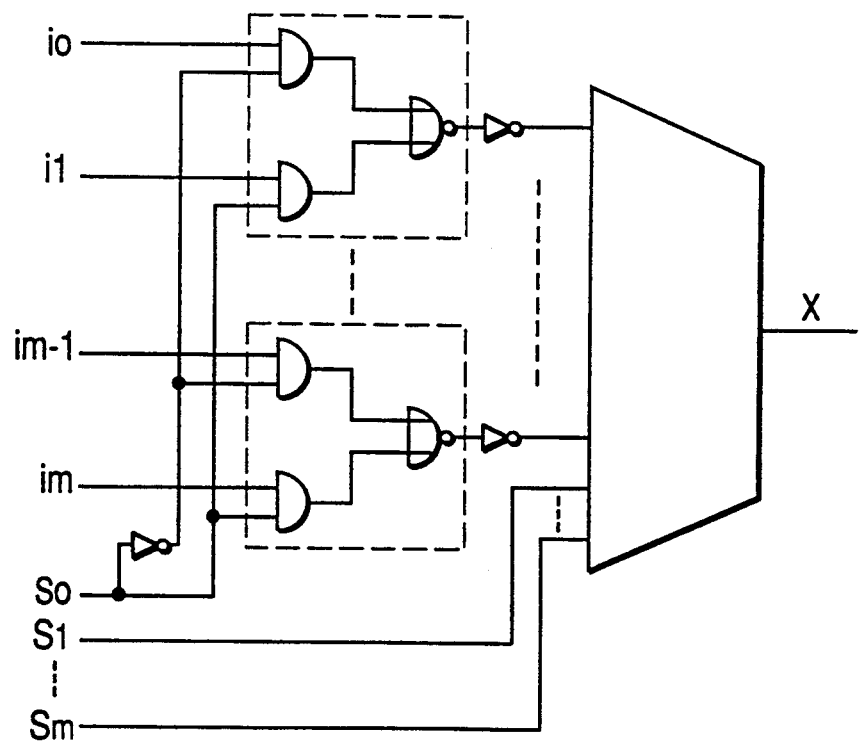

FIG. 21 to FIG. 25 illustrates an example of introducing the second embodiment of the present invention explained above into the circuit design process. FIG. 21 represents a selector circuit. The selection circuit of FIG. 21 selects any one of the input signals $i_0-i_m$ with the selection signals $S_0-S_m$ and outputs the selection as the output signal X. For instance, when $S_0-S_m$ are all zero, $i_0$ is selected as the output signal. When $S_0$ is 1 and others $S_1-S_m$ are zero, $i_1$ is selected. Here, $m+1$ is set to $2^{(n+1)}$ (namely, the number of i's should be set to the value divided by 2). Therefore, designing this selection circuit using a practical circuit is a problem. What kind of circuit structure should be used to realize the circuit?

The different conditions of circuit design are simplified into a case which uses two input signals (FIG. 22A, FIG. 22B), and a case using three or more input signals (FIG. 23A, FIG. 23B) (FIG. 24A, FIG. 24B) Accordingly, the following rule bases are provided.

| RULE 1: | |
|---|---|
| IF | Two i terminals are provided and two 2-input AND circuits and a AND-NOR cell for combining outputs of the two AND circuits with the NOR circuit exist. |
| THEN | A circuit is provided using a AND-NOR cell and an inverter. |

| -continued | |
|---|---|
| | (FIG. 22A, 22B). |
| RULE 2: | |
| IF | Three or more i terminals are provided, two 2-input AND circuits and a AND-NOR cell for combining outputs of two AND circuits with a NOR circuit exist. |
| THEN | A circuit is provided consisting of the AND-OR cell having two i terminals and a selecting circuit for selecting the one i terminal of the two and the same is also applied to the next selecting circuit. (FIG. 23A, FIG. 23B). |
| RULE 3: | |
| IF | Three or more i terminals are provided, a plurality of 2-input AND circuits and an AND-OR cell for combining the AND circuit and an OR circuit for obtaining the OR of the plurality of output signal of AND circuits exists. |
| THEN | A circuit is provided consisting of a plurality of 2-input AND circuits, an AND-NOR cell combining an AND circuit and OR circuit for obtaining the OR of a plurality of output signals of such AND circuits and a decoder circuit. (FIG. 24A, FIG. 24B) |

Figure 24A:
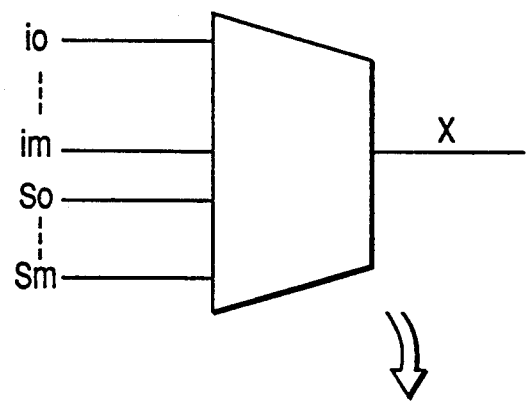
FIGS. 24A and 24B are diagrams indicating another example of m inputs in the present invention.
Figure 24B:
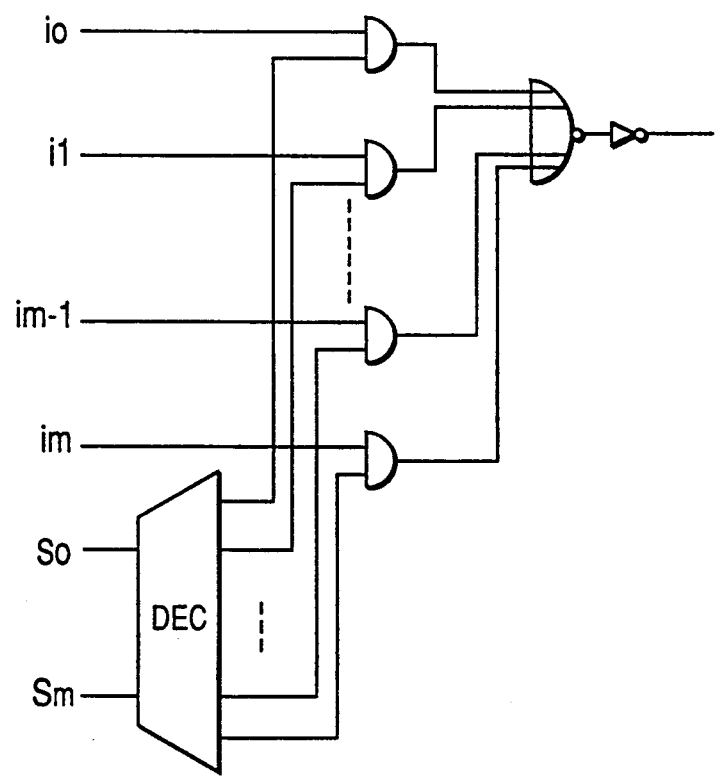

Among these rules 1-3, the rule 2 and rule 3 may respectively be realized with different circuit structures for a circuit substantially having the same function. However, the circuit structure obtained by the rule 2 has the advantage that the area may be reduced since the entire part may be formed by a CMOS unit of the structure of the AND-NOR circuit shown in FIG. 22B. On the other hand, as shown in FIG. 24B, the circuit structure obtained by the rule 3 provides less circuit stages for the input signal than that of FIG. 23B and produces a high speed circuit, however, the area is larger than that of FIG. 23B since a decoding circuit for the selection signal is necessary. Accordingly, the rule sequence is the rules 1 through 3, the area is always considered first. With the rule sequence the rule 1, rule 3 and rule 2 are the rule base for obtaining high speed operation circuit is provided. As explained previously, the rules 1, 2, 3 are arranged sequentially, for the design of an area-first circuit, in the evaluation sequence table provided for the inference engine and the rule base, and the rules are arranged 1, 3, 2 are for the design of a speed-first circuit in another evaluation table.

Figure 25A:
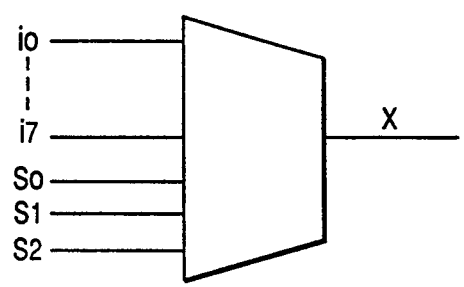
FIGS. 25A, B and C show practical examples for explaining the circuit of eight inputs and one output in the present invention.
Figure 25B:
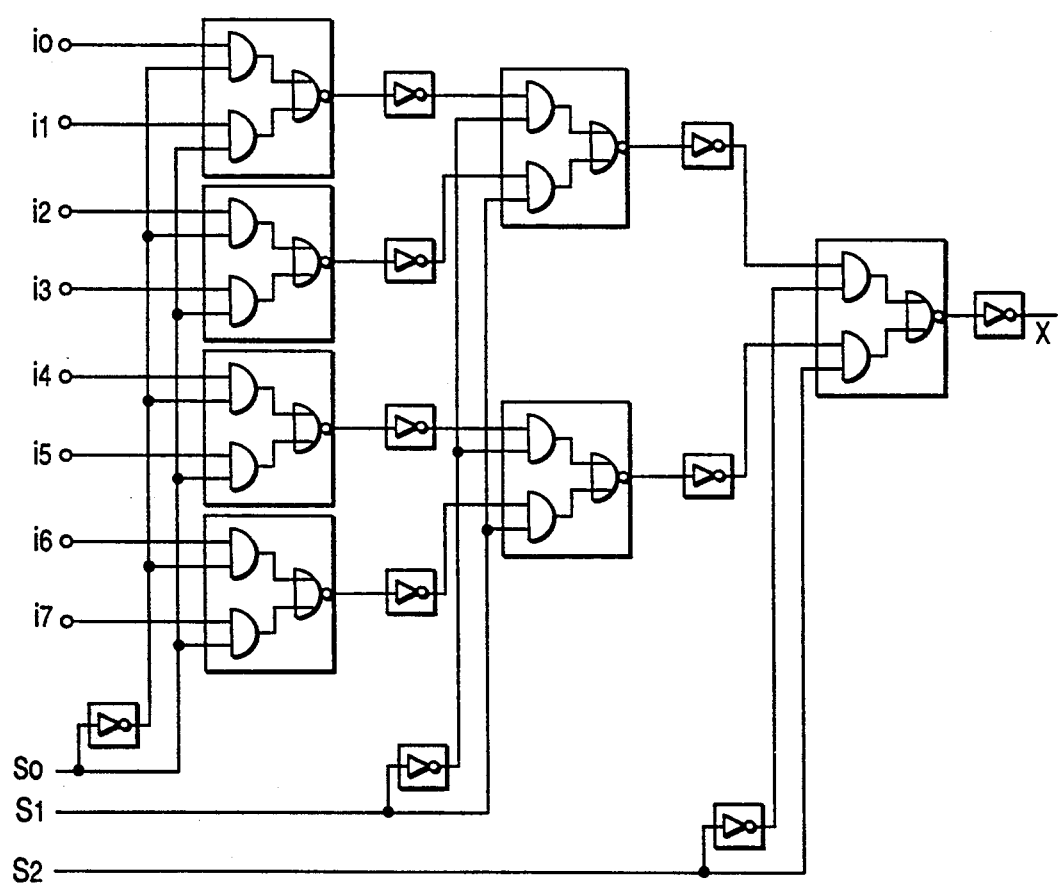
Figure 25C:
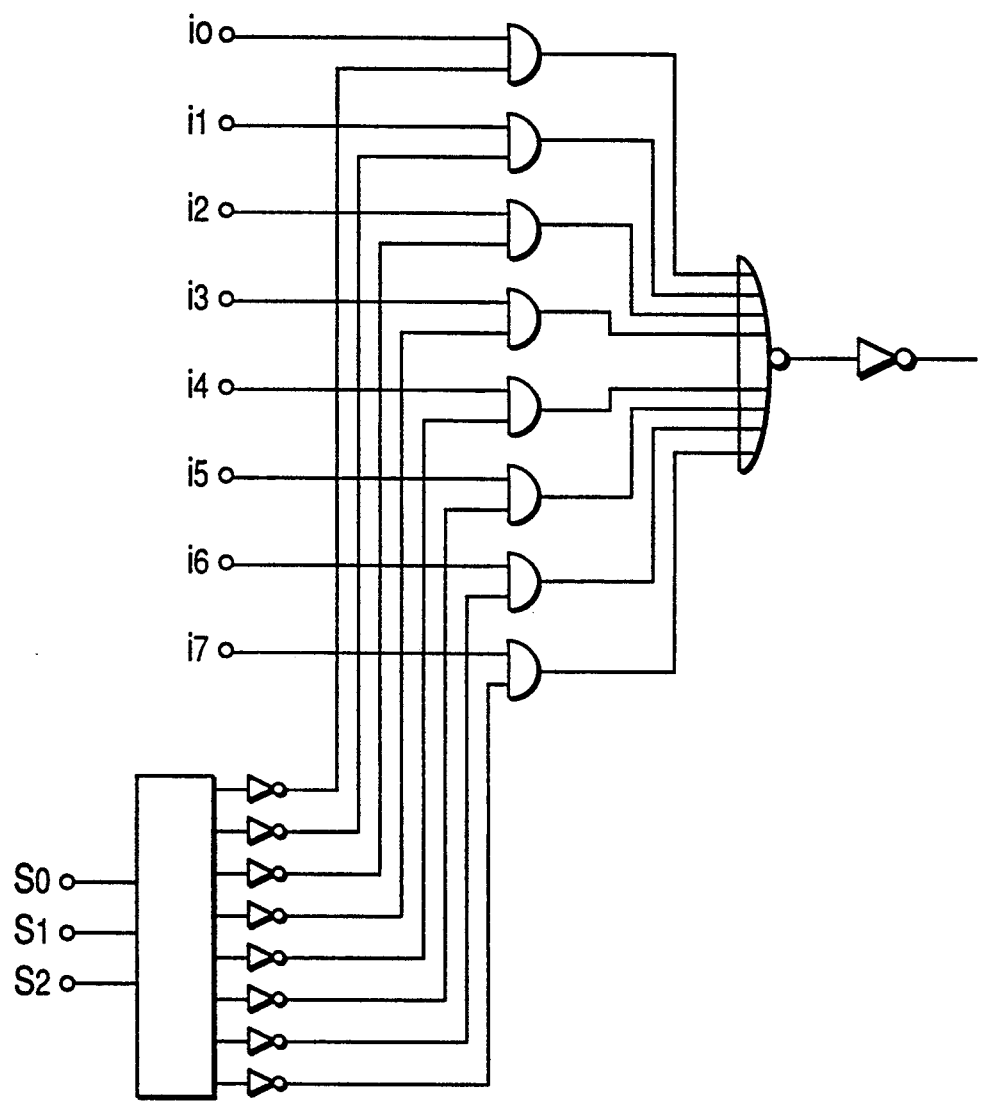

FIG. 25A, FIG. 25B and FIG. 25C show examples of the selecting circuit providing eight input signals i and an output signal X. As shown in FIG. 25A, the input signals $i_0-i_7$ are selected by a three bit selection signals $S_0-S_1$, $S_2$. The circuit structure generated on the basis of the area-first concept is as shown in FIG. 25B, and that on the basis of the speed-first concept is as shown in FIG. 25C.

According to the present invention, it becomes possible to correctly operate the rule base by changing the evaluation sequence using external data without adding a condition to the condition section of the rules. Therefore, it is no longer necessary to change the rule base or generate plural rule bases, and the efficiency of the rule base can thereby be improved. Moreover, since the evaluation sequence of the rules may be changed freely with the data supplied from external circuits, efficient evaluation of the rule base can be easily realized.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A rule base processing system, comprising:
   an inference engine;
   a rule base storage, operatively connected to said inference engine, including:
      knowledge source blocks having a selection mode and rules arranged in a first priority sequence, at least some of said knowledge source blocks further including a priority sequence table describing a second priority sequence of the rules, each of the rules including a condition and a procedure; and
      a control block having a knowledge source list of said knowledge source blocks in said rule base storage to be executed by said inference engine; and
   a rule base compiler, operatively connected to said rule base storage, to compile said rule base storage and generate a program for executing the rules in one of the first and second priority sequences, the program executing in each knowledge source block having a single rule selection mode, only the procedure of a first rule having a condition that is satisfied.

2. A rule base processing system as recited in claim 1, wherein said control block further comprises a function name designating section which stores a function name corresponding to the knowledge source blocks.

3. A rule base processing system as recited in claim 1, wherein said rule base processing system further comprises external control means for externally creating and controlling the sequence of rule evaluation.

4. A rule base processing system as recited in claim 3, wherein
   said rule base processing system further comprises a terminal, operatively connected to said rule base storage, said inference engine, and said external control means, and said external control means includes:
   start control means for receiving a start request from the terminal and sending an information transfer request to the terminal;
   evaluation sequence control means for receiving evaluation sequence data input through the terminal in response to the transfer request; and
   executing means for executing the rules using the inference engine in a sequence conforming to the evaluation sequence data.

5. A rule base processing system as recited in claim 4, wherein the evaluation sequence control data received by said evaluation sequence control means includes a rule number list, and said executing means executes the rules responsive to the sequence indicated by the rule number list.

6. A rule base processing system as recited in claim 4, wherein the evaluation sequence control data includes an application condition indicating execution or nonexecution of the rules, and wherein said executing means executes the rules in conformity with the sequence indicated by a rule number list previously stored and corresponding to the application condition.

7. A rule base processing system as recited in claim 1, wherein said control block designates a first of said knowledge source blocks in the knowledge source list to be executed by the inference engine.

8. A rule base processing system as recited in claim 1, wherein said knowledge source blocks can designate other knowledge source blocks to be executed by the inference engine on an event list.

9. A rule base processing system as recited in claim 8, wherein said other knowledge source blocks are selected from the event list by traversing an event queue in a predetermined order.

10. A method, performed by a computer system, of executing rules in a rule base source to be processed by an inference engine, said method comprising the steps of:
    (a) storing the rules in knowledge blocks with said computer system;
    (b) storing a list of the knowledge blocks in a control block with said computer system;
    (c) storing a function name corresponding to the control block; and
    (d) executing in said computer system the knowledge blocks responsive to the list, including calling a group of the knowledge blocks listed in the control block as a subroutine using the function name corresponding to the control block.

11. A method as recited in claim 10, wherein said computer system further performs the step of storing a priority sequence table in the knowledge source blocks indicating a priority sequence of the rules and executing the rules responsive to the table.

12. A method as recited in claim 10, wherein the rules contain selectable rules, and wherein said computer system further performs the steps of:
    (d) evaluating the selectable rules; and
    (e) selecting one of the selectable rules.

13. A method as recited in claim 10, wherein the rules each have a condition and a procedure, and wherein said computer system further performs the steps of:
    (d) executing the rules in a priority sequence when a priority control is designated within said knowledge blocks;
    (e) executing only the procedure of a first rule having a condition that is satisfied, when a single rule selection mode is designated within said knowledge blocks; and
    (f) executing the procedure of all of the rules having a condition that is satisfied, when a multiple rule selection mode is designated.

14. A method as recited in claim 10, wherein said computer system further performs the step of designating a first of said knowledge source blocks in the knowledge source list to be executed by the inference engine.

15. A method as recited in claim 14, wherein said computer system further performs the step of (e) designating, with said knowledge source blocks, other knowledge source blocks to be executed by the inference engine on an event list.

16. A method as recited in claim 15, wherein in step (e) said computer system performs the step of selecting the other knowledge source blocks from the event list by traversing an event queue in a predetermined order.

17. A method, performed by a computer system, of compiling a rule base source including rules each having a procedure and a condition, said method comprising the steps of:

(a) determining with said computer system whether only a single procedure is to be executed when the condition is satisfied, or whether the procedure for all of the rules in which the condition is satisfied is to be executed;

(b) determining with said computer system whether the rules are to be executed in a priority conforming to a priority sequence table; and (c) arranging executing of the rules with said computer system in accordance with the priority of the priority sequence table and the result of the determination in step (a).

18. An expert system, comprising:

rules storage storing rules;

priority storage storing an evaluation priority list indicating the priority of evaluation of the rules;

an inference engine evaluating the rules in accordance with the evaluation priority;

wherein said priority storage stores plural priority tables each including an evaluation priority list and the priority tables being selectable by a user; and further comprising means for allowing a user to enter the evaluation priority list.

19. A rule base processing system, comprising:

an inference engine;

a rule base storage, operatively connected to said inference engine, including:

knowledge source blocks having a selection mode and rules arranged in a first priority sequence, at least some of said knowledge source blocks further including a priority sequence table describing a second priority sequence of the rules, each of the rules including a condition and a procedure; and a control block having a knowledge source list of said knowledge source blocks in said rule base storage to be executed by said inference engine; and a rule base compiler, operatively connected to said rule base storage, to compile said rule base storage to generate a program for executing the rules in one of the first and second priority sequences, the program executing, in each knowledge source block having a multiple rule selection mode, the procedure of all of the rules having a condition that is satisfied.

* * * * *